(12) United States Patent
Chang et al.

(10) Patent No.: US 10,127,859 B2
(45) Date of Patent: Nov. 13, 2018

(54) ELECTROLUMINESCENT DISPLAY

(71) Applicant: LG Display Co., Ltd., Seoul (KR)

(72) Inventors: Sungwook Chang, Goyang-si (KR); Juhnsuk Yoo, Seoul (KR); Jungchul Kim, Paju-si (KR); Sungwook Yoon, Goyang-si (KR); Hoyoung Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/621,866

(22) Filed: Jun. 13, 2017

(65) Prior Publication Data

US 2018/0190197 A1   Jul. 5, 2018

(30) Foreign Application Priority Data

Dec. 29, 2016  (KR) ......................... 10-2016-0183098
Feb. 6, 2017   (KR) ......................... 10-2017-0016125

(51) Int. Cl.
   *G09G 3/3258*   (2016.01)
   *G09G 3/3233*   (2016.01)
   *H01L 27/32*   (2006.01)

(52) U.S. Cl.
   CPC ......... *G09G 3/3258* (2013.01); *G09G 3/3233* (2013.01); *H01L 27/3262* (2013.01);
   (Continued)

(58) Field of Classification Search
   CPC .. G09G 3/3258; G09G 3/3208; G09G 3/3225; G09G 3/3216; G09G 3/3233
   See application file for complete search history.

(56) References Cited

U.S. PATENT DOCUMENTS

2006/0221662 A1   10/2006  Park et al.
2016/0247452 A1*  8/2016   Lee ..................... H01L 27/3276

FOREIGN PATENT DOCUMENTS

EP   1923857 A2   5/2008
EP   2219174 A1   8/2010

OTHER PUBLICATIONS

European Extended Search Report, European Application No. 17184659.5, dated Oct. 10, 2017, 9 pages.

* cited by examiner

*Primary Examiner* — Dennis Joseph
(74) *Attorney, Agent, or Firm* — Fenwick & West LLP

(57) ABSTRACT

An electroluminescent display is disclosed. An electroluminescent display comprises a display panel including a plurality of pixels, each of the plurality of pixels including subpixels. A pixel circuit of each subpixels includes a driving transistor configured to drive the electroluminescent diode, a first switching transistor configured to supply a first voltage to a gate of the driving transistor in response to a first scan signal, a second switching transistor configured to supply a second voltage to the gate of the driving transistor in response to a second scan signal, a third switching transistor configured to supply the second voltage to a first electrode of the driving transistor in response to the second scan signal, a fourth switching transistor configured to supply a first supply voltage to a second electrode of the driving transistor in response to an emission control signal, a first capacitor between a first node connected to the gate electrode of the driving transistor and a second node connected to the second electrode of the driving transistor, and a second capacitor between the second node and a power supply line supplied with the second voltage or the first supply voltage.

18 Claims, 29 Drawing Sheets

(52) U.S. Cl.
CPC . *H01L 27/3265* (2013.01); *G09G 2300/0814* (2013.01); *G09G 2300/0819* (2013.01); *G09G 2300/0852* (2013.01); *G09G 2300/0866* (2013.01); *G09G 2320/0233* (2013.01); *G09G 2320/0238* (2013.01); *G09G 2320/0252* (2013.01); *G09G 2320/045* (2013.01)

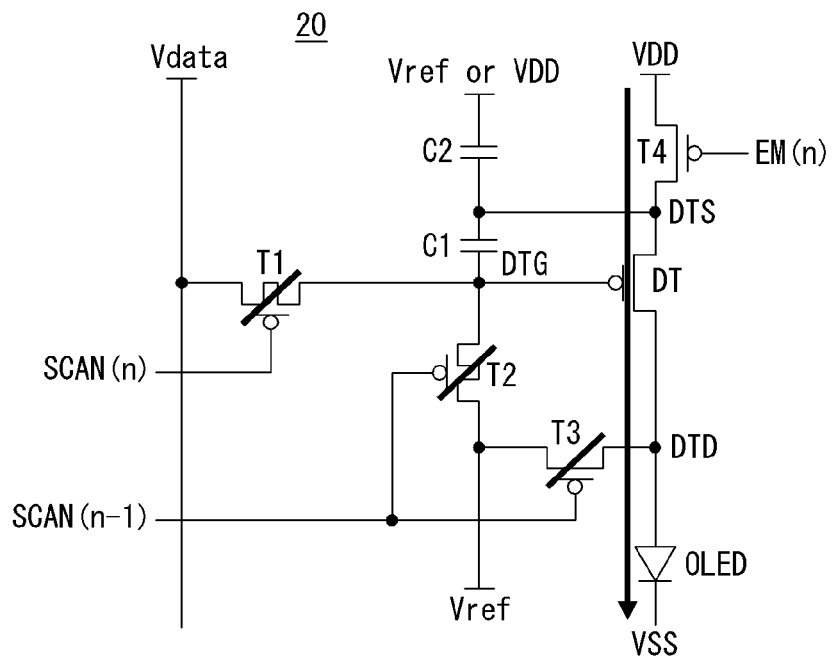
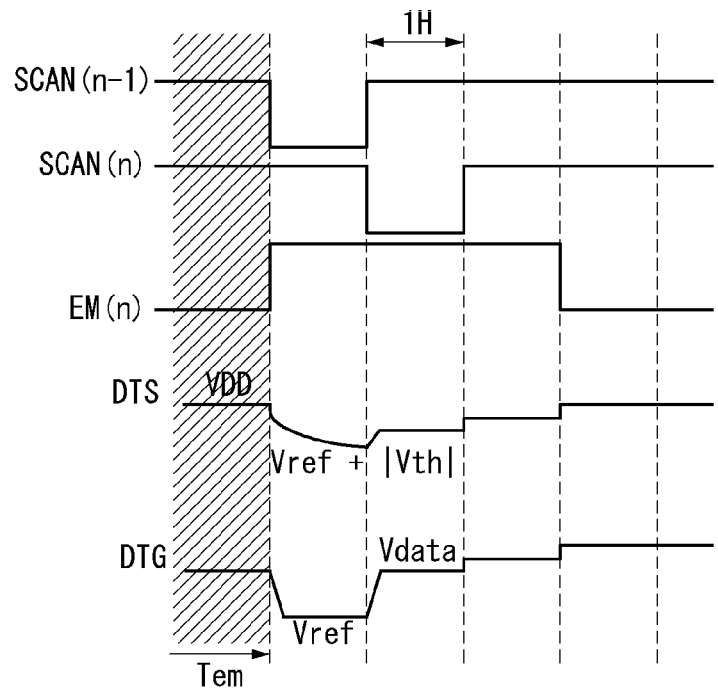
FIG. 4

FIG. 5
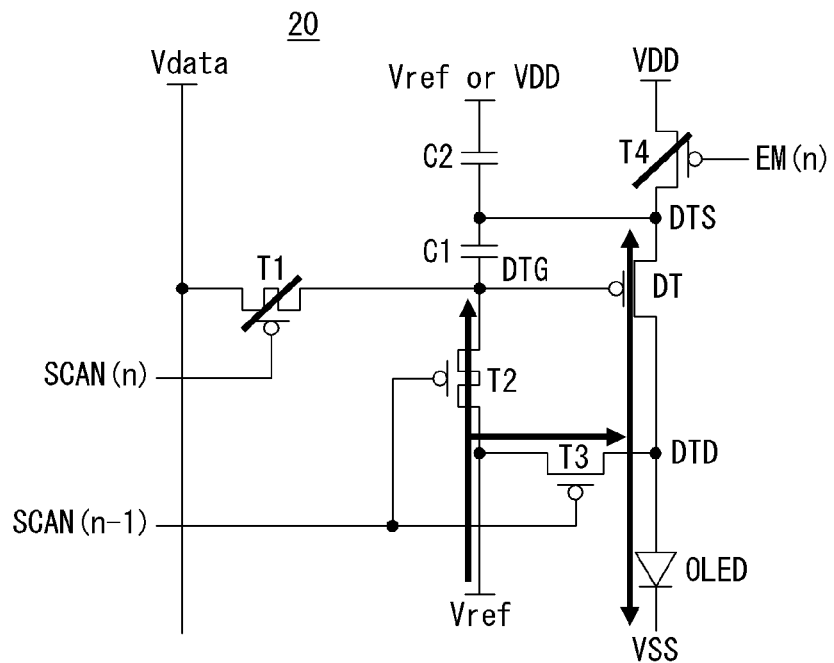
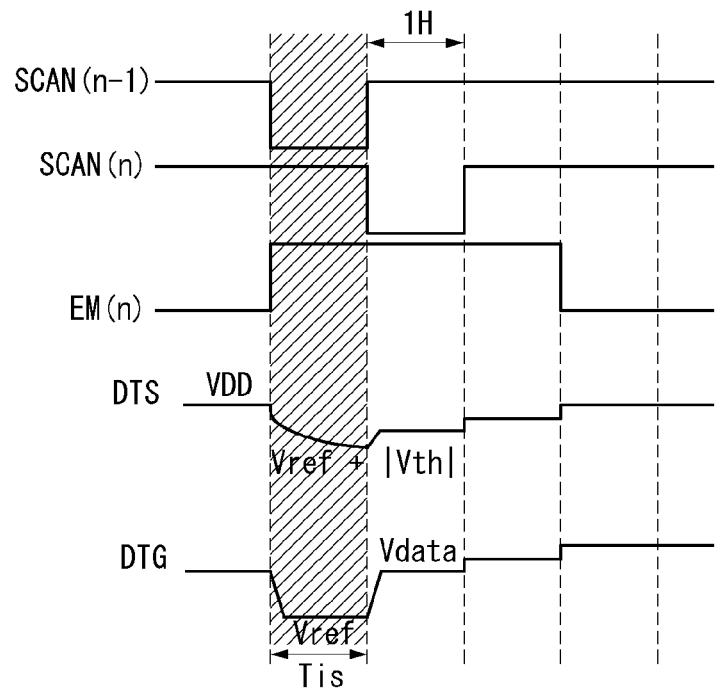

FIG. 6
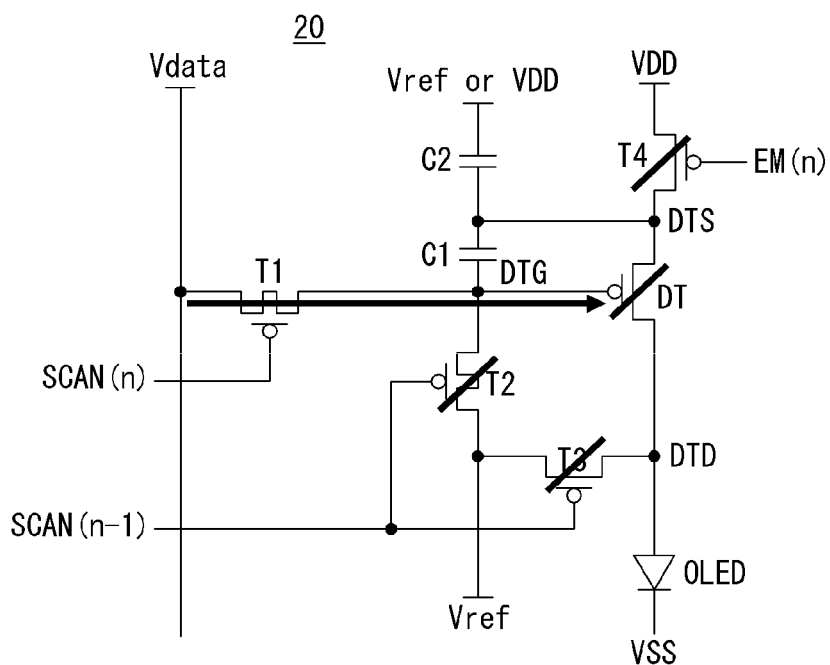
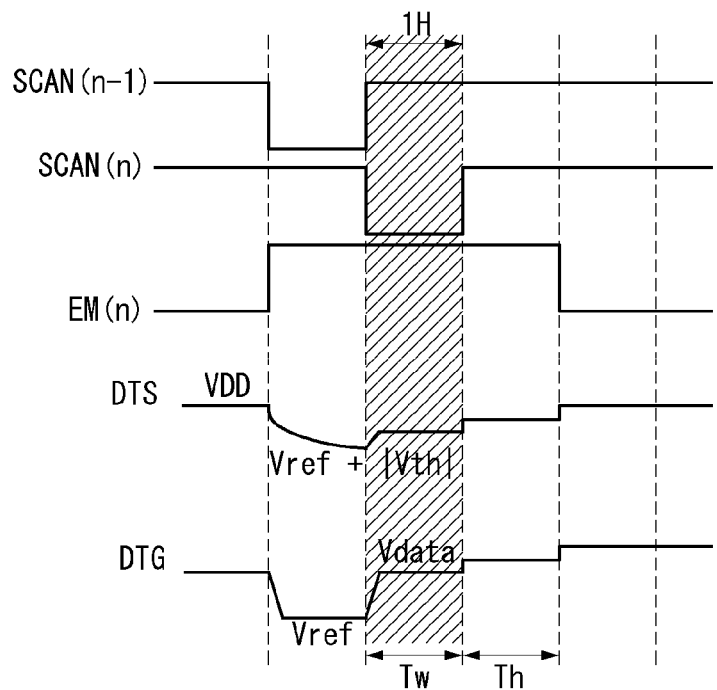

FIG. 7
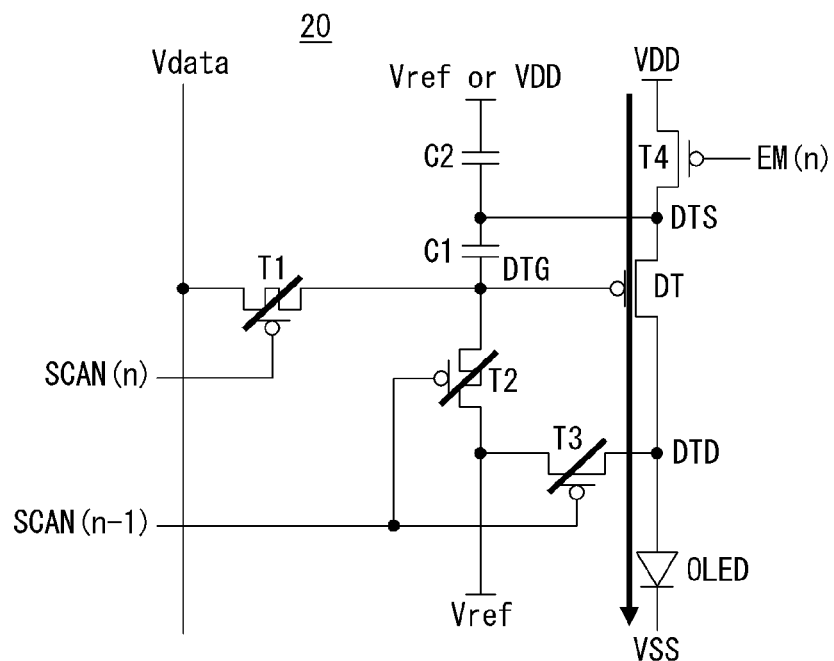
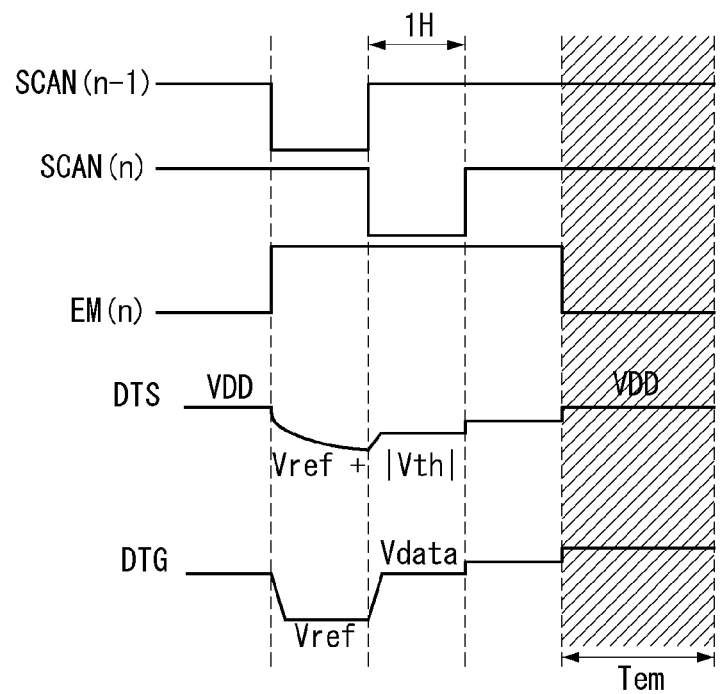

FIG. 9
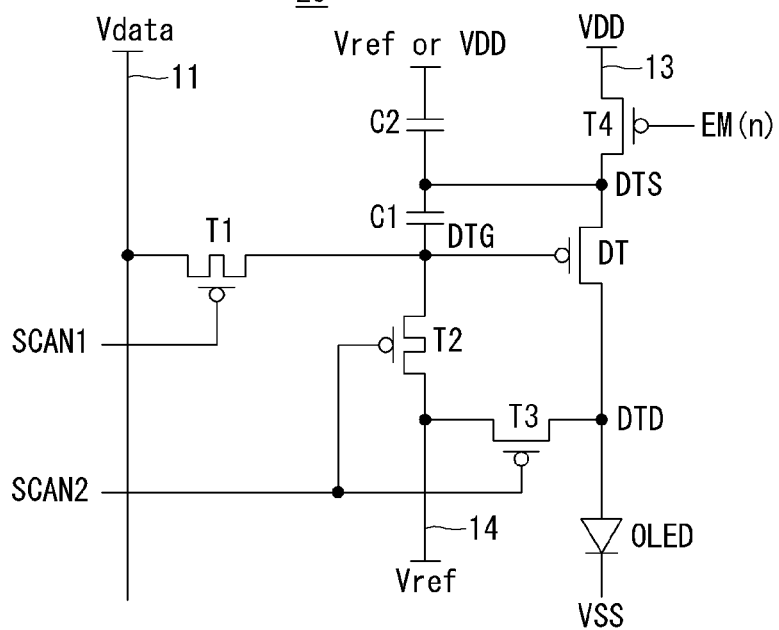
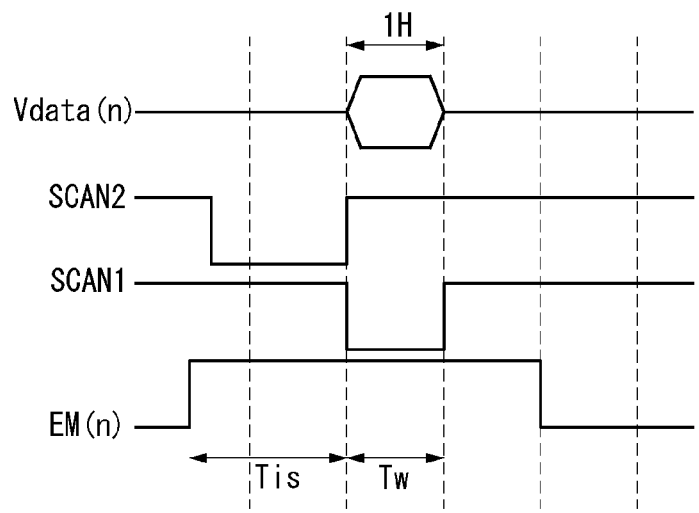

FIG. 12
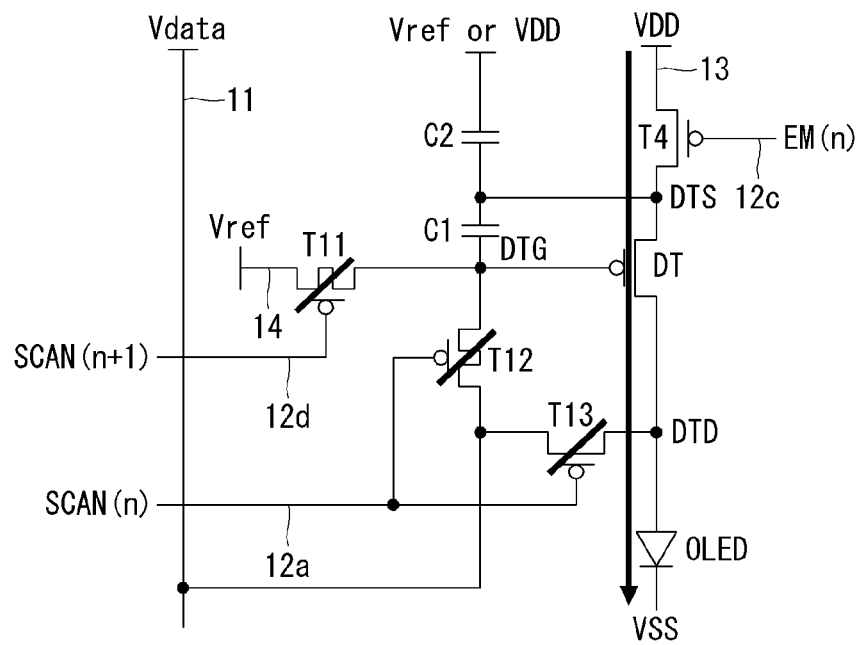
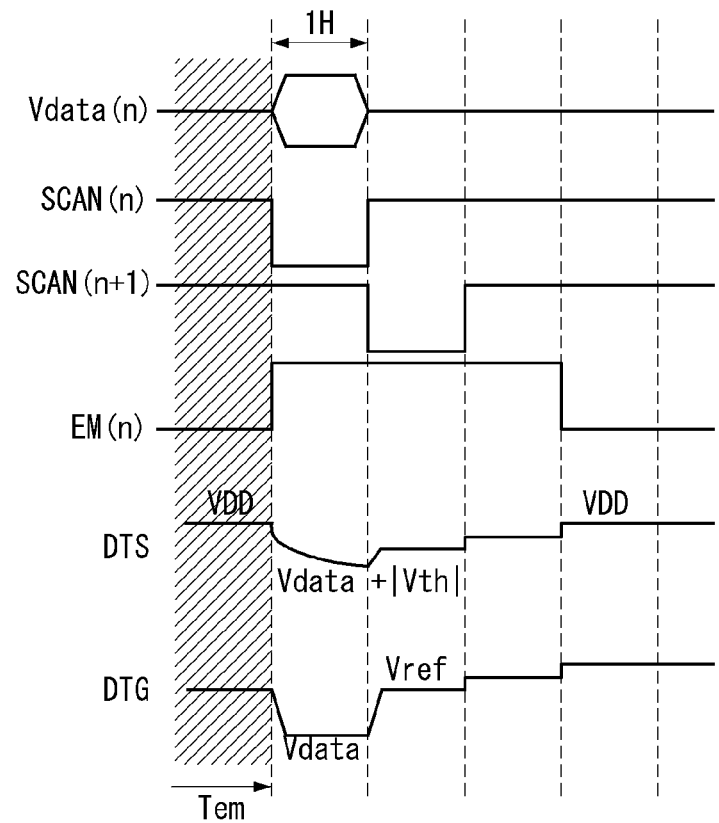

FIG. 13
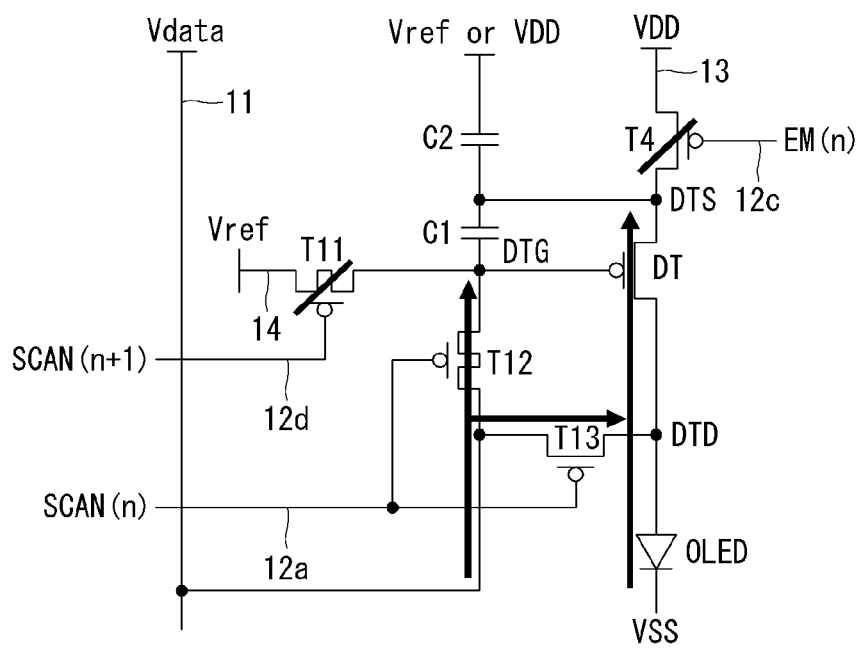
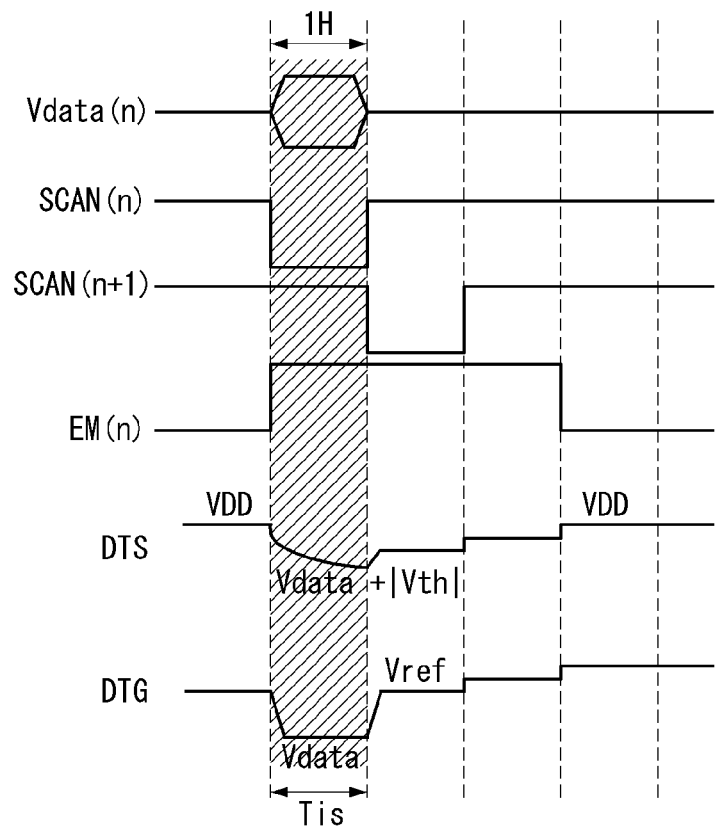

FIG. 14
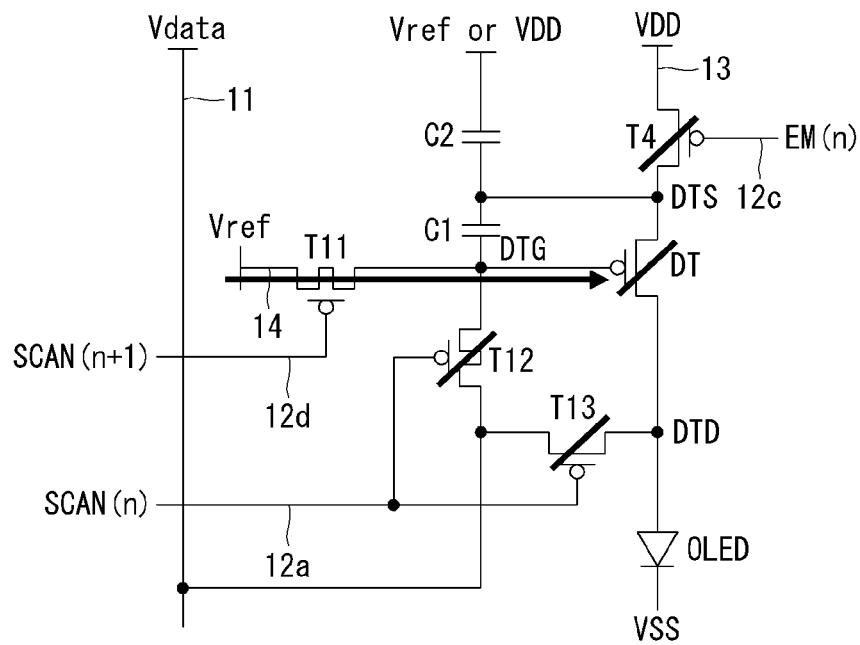
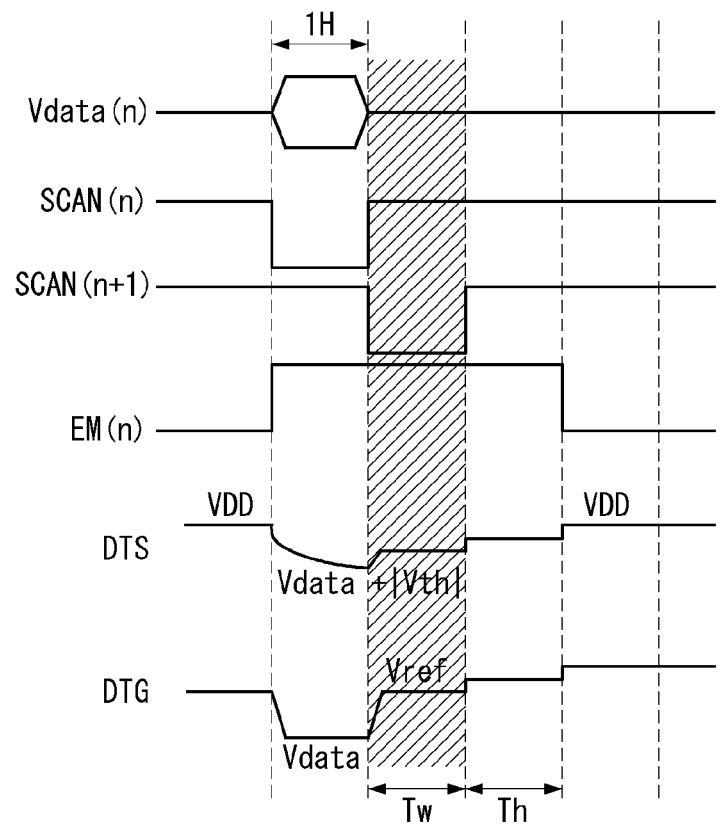

FIG. 15
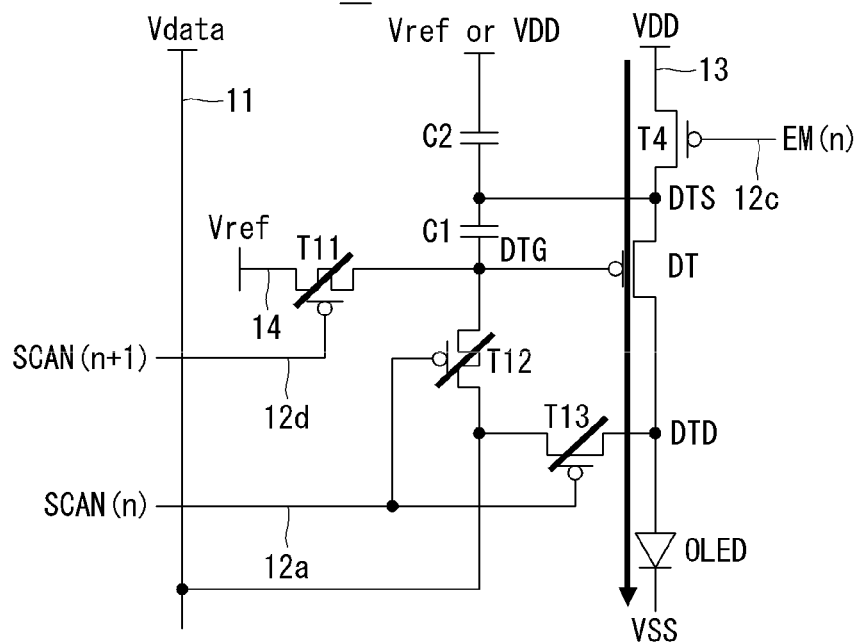
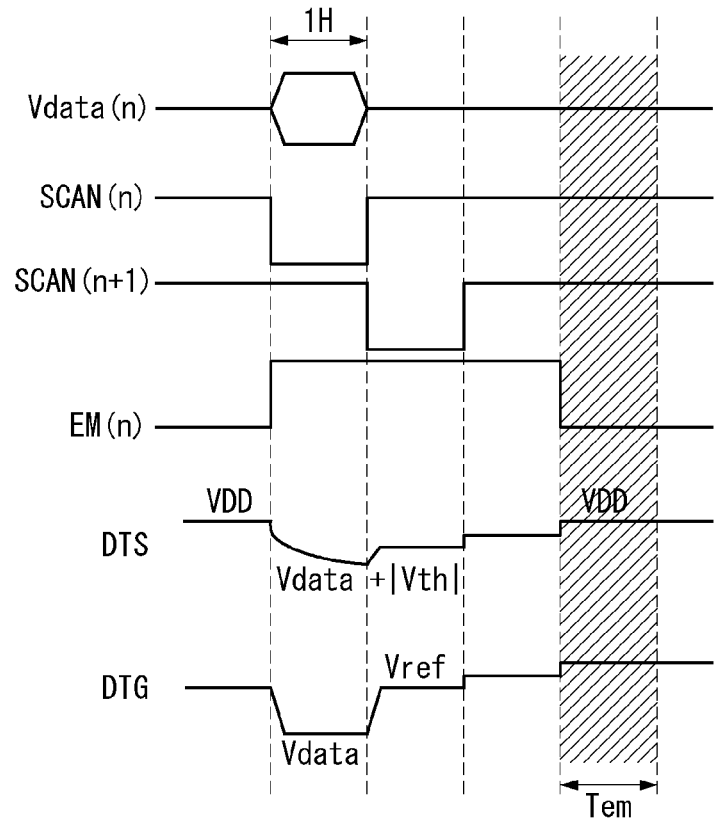

20-1

30-1

40-1

30-2

FIG. 24
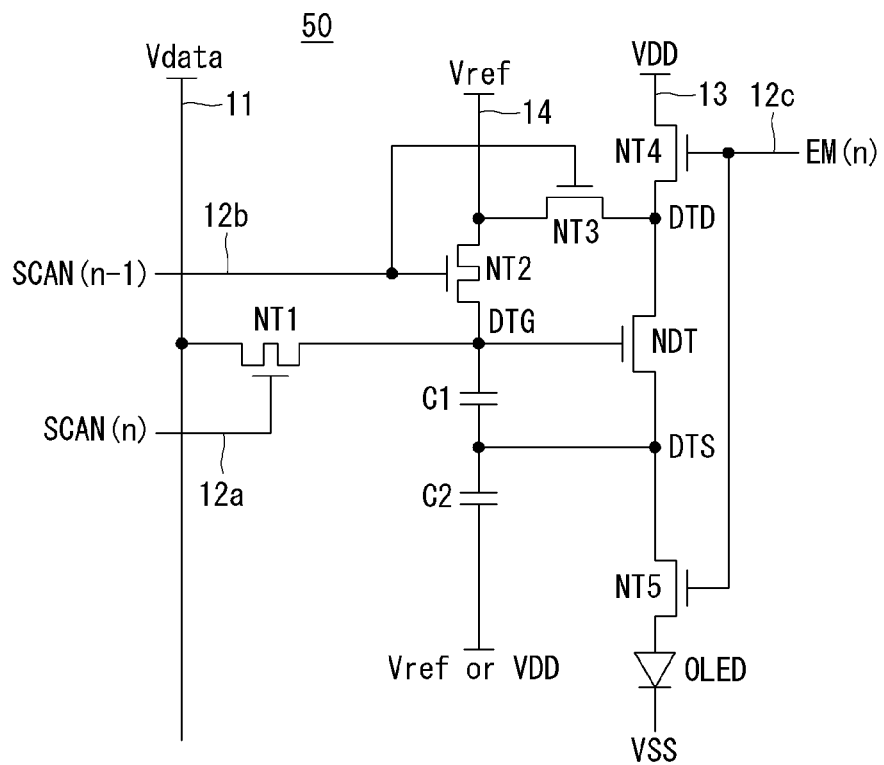
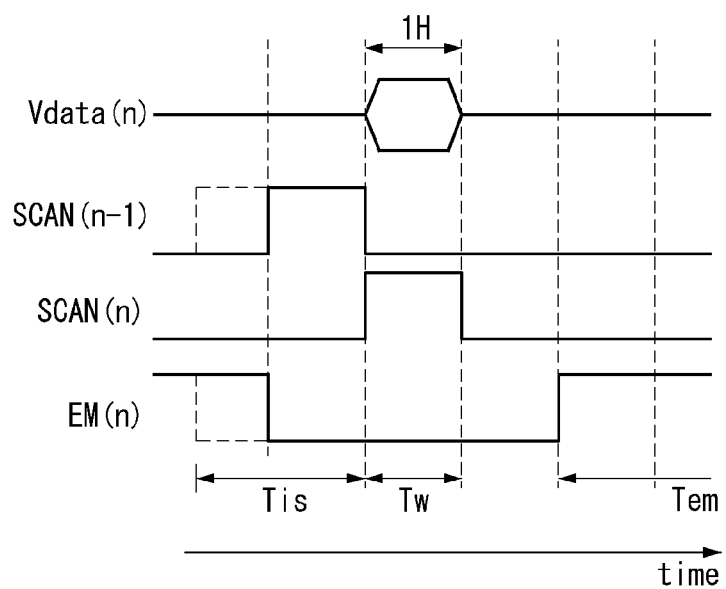

ELECTROLUMINESCENT DISPLAY

This application claims the benefit of Korean Patent Application No. 10-2016-0183098 filed on Dec. 29, 2016, and Korean Patent Application No. 10-2017-0016125 filed on Feb. 6, 2017, each of which is incorporated herein by reference in its entirety.

BACKGROUND

Technical Field

The present disclosure relates to an electroluminescent display.

Discussion of the Related Art

An electroluminescent display is classified into an inorganic electroluminescent display and an organic electroluminescent display depending on a material of an emission layer. An active matrix organic light emitting diode (OLED) display includes a plurality of OLEDs capable of emitting light by themselves and has many advantages, such as fast response time, high emission efficiency, high luminance, wide viewing angle, and the like.

An OLED serving as a self-emitting element includes an anode, a cathode, and an organic compound layer between the anode and the cathode. The organic compound layer typically includes a hole injection layer HIL, a hole transport layer HTL, an emission layer EML, an electron transport layer ETL, and an electron injection layer EIL. When a power voltage is applied to the anode and the cathode, holes passing through the hole transport layer HTL and electrons passing through the electron transport layer ETL move to the emission layer EML and form excitons. Hence, the emission layer EML generates visible light by the excitons.

An OLED display includes a plurality of pixels, each including an OLED and a thin film transistor (TFT), in a matrix and adjusts a luminance of an image implemented on the pixels based on a grayscale of image data. The TFT may include a driving TFT for adjusting an amount of current of an OLED depending on data and a switching TFT for switching on and off a current path of a pixel circuit. The driving TFT controls a driving current flowing in the OLED depending on a voltage (hereinafter, referred to as "a gate-to-source voltage") between a gate electrode and a source electrode of the driving TFT. An amount of light emitted by the OLED and a luminance of an image are determined depending on the driving current of the OLED.

When all the pixels are the same in driving characteristics such as a threshold voltage and electron mobility of the driving TFT, the uniform image quality not having a difference in luminance and color between the pixels can be implemented. However, there may be a difference in the driving characteristics between the pixels by various causes including a process variation, etc. And, the difference in the driving characteristics between the pixels may increase because the pixels have different deterioration progress speeds depending on a driving time of the OLED display. Thus, an amount of the driving current flowing in the OLED is changed depending on the difference in the driving characteristics between the pixels. As a result, non-uniformity of the pixels is caused.

In order to improve image quality and lifespan of the electroluminescent display, a compensation circuit for compensating for the difference in the driving characteristics between the pixels is applied to the electroluminescent display. The compensation circuit may use an internal compensation method and an external compensation method. The internal compensation method samples a gate-to-source voltage of the driving TFT that is changed depending on electrical characteristics of the driving TFT, using an internal compensation circuit inside the pixel. The internal compensation method compensates for a data voltage with the sampled gate-to-source voltage. The external compensation method senses a voltage of the pixel, that is changed depending on electrical characteristics of the driving TFT, using a sensing circuit connected to the pixel and modulates pixel data (or digital data) of an input image based on the sensed voltage using an external compensation circuit.

SUMMARY

A luminance of an organic light emitting diode (OLED) in an internal compensation circuit may be affected by a first supply voltage (hereinafter referred to as "VDD") of a pixel. In this instance, when the VDD varies depending on a position of a pixel in a screen due to a voltage drop (i.e., "IR drop") of the VDD, there occurs a difference between a current of the OLED and a required current of the pixel. Hence, an electroluminescent display cannot obtain the uniform image quality. In order to reduce the voltage drop of the VDD, a width of a VDD line may increase. However, because a width of a VDD line in a high resolution display panel needs to be narrowed and a length of the VDD line needs to be long, there is a limit to improving the voltage drop of the VDD using a method of reducing a VDD resistance in a large-screen display panel with high resolution.

A current may flow in the internal compensation circuit because the VDD and a reference voltage (hereinafter referred to as "Vref") are short-circuited in an initialization operation for initializing the pixels. Such a short-circuit current results in increasing power consumption and accelerating the deterioration of a thin film transistor (TFT) of the pixel.

With a trend toward a high resolution and a high-speed drive of electroluminescent displays, a difference in driving characteristics between pixels cannot be sufficiently compensated by an existing compensation method. For example, as a resolution and a driving frequency increase, one horizontal period, in which data is written to pixels on one line of a display panel, may decrease. Therefore, a sampling period of a threshold voltage of a driving TFT allocated during one horizontal period may decrease. When a time required to sample the threshold voltage of the driving TFT is insufficient, an inaccurate sampling value of the threshold voltage of the driving TFT is obtained, thereby leading to a difference in the driving characteristics between the pixels on the screen. The difference in the driving characteristics between the pixels generates a luminance difference even when data of the same gray level is written to all the pixels, and appears as a spot on the screen.

The present disclosure provides an electroluminescent display capable of compensating for a change in driving characteristics of pixels in real time.

An electroluminescent display according to the present disclosure includes a display panel including a plurality of pixels, each of the plurality of pixels including subpixels. A pixel circuit of each subpixel includes a driving transistor connected to an anode of an electroluminescent diode, the driving transistor and configured to drive the electroluminescent diode, a first switching transistor connected to the driving transistor, the first switching transistor configured to supply a first voltage to a gate electrode of the driving transistor in response to a first scan signal, a second switching transistor connected to the driving transistor, the second switching transistor configured to supply a second voltage to the gate electrode of the driving transistor in response to a second scan signal, a third switching transistor connected to the second switching transistor and the driving transistor, the third switching transistor configured to supply the second voltage to a first electrode of the driving transistor in response to the second scan signal, a fourth switching transistor connected to the driving transistor, the fourth switching transistor configured to supply a first supply voltage to a second electrode of the driving transistor in response to an emission control signal, a first capacitor connected between a first node that is connected to the gate electrode of the driving transistor and a second node that is connected to the second electrode of the driving transistor, and a second capacitor connected between the second node and a power supply line supplied with the second voltage or the first supply voltage. A second supply voltage is applied to a cathode of the electroluminescent diode, the second supply voltage lower than the first supply voltage Thus, the electroluminescent display according to the present disclosure can implement uniform image quality over the entire screen without designing VDD lines at a low resistance and can reduce power consumption because the high potential driving voltage and a reference voltage are not short-circuited.

An electroluminescent display according to the present disclosure includes a display panel including a plurality of pixels each of the plurality of pixels including subpixels. A pixel circuit of each subpixel includes a driving transistor connected to an anode of an electroluminescent diode, the driving transistor configured to drive the electroluminescent diode, a switching circuit configured to supply a reference voltage that is less than a first supply voltage and greater than a second supply voltage that is less than the first supply voltage to a gate electrode and a first electrode of the driving transistor in response to a (n−1)th scan signal, the switching circuit configured to supply a data voltage to the gate electrode of the driving transistor in response to an nth scan signal, and the switching circuit configured to supply the first supply voltage to a second electrode of the driving transistor in response to an emission control signal, where n is a positive integer, a first capacitor connected between a first node that is connected to the gate electrode of the driving transistor and a second node that is connected to the second electrode of the driving transistor, and a second capacitor connected between the second node and a power supply line supplied with the reference voltage or the first supply voltage. The second supply voltage is applied to a cathode of the electroluminescent diode. Thus, the electroluminescent display according to the present disclosure can implement uniform image quality over the entire screen without designing VDD lines at a low resistance and can reduce power consumption because the high potential driving voltage and the reference voltage are not short-circuited.

An electroluminescent display according to the present disclosure includes a display panel including a plurality of pixels, each of the plurality of pixels including subpixels. A pixel circuit of each subpixel includes a driving transistor connected to an anode of an electroluminescent diode, the driving transistor configured to drive the electroluminescent diode, a first switching transistor connected to the driving transistor, the first switching transistor configured to supply a data voltage to a gate electrode of the driving transistor in response to an nth scan signal, where n is a positive integer, a second switching transistor connected to the driving transistor, the second switching transistor configured to supply a reference voltage that is less than a first supply voltage and greater than a second supply voltage that is less than the first supply voltage to the gate electrode of the driving transistor in response to an (n−1)th scan signal, a third switching transistor configured to supply the reference voltage to a first electrode of the driving transistor in response to the (n−1)th scan signal, a fourth switching transistor connected to the driving transistor, the fourth switching transistor configured to supply the first supply voltage to the second electrode of the driving transistor in response to an emission control signal, a fifth switching transistor connected between the driving transistor and the electroluminescent diode, the fifth switching transistor configured to form a current path between the second electrode of the driving transistor and the anode of the electroluminescent diode in response to the emission control signal, a first capacitor connected between a first node that is connected to the gate electrode of the driving transistor and a second node that is connected to the second electrode of the driving transistor, and a second capacitor connected between the second node and a power supply line supplied with the reference voltage or the first supply voltage. The second supply voltage is applied to a cathode of the electroluminescent diode. Thus, the electroluminescent display according to the present disclosure can implement uniform image quality over the entire screen without designing VDD lines at a low resistance and can reduce power consumption because the high potential driving voltage and the reference voltage are not short-circuited.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIGS. 4 to 7 illustrate an operation of a pixel circuit shown in FIG. 3 in stages according to one embodiment;

FIG. 9 illustrates an example where a pulse width of a scan signal applied to a pixel circuit is extended according to one embodiment;

FIGS. 11 to 15 illustrate a pixel circuit and a method of driving the same according to a second embodiment of the disclosure;

FIG. 24 illustrates a pixel circuit and a method of driving the same according to a third embodiment of the disclosure;

DETAILED DESCRIPTION

Figure 1:
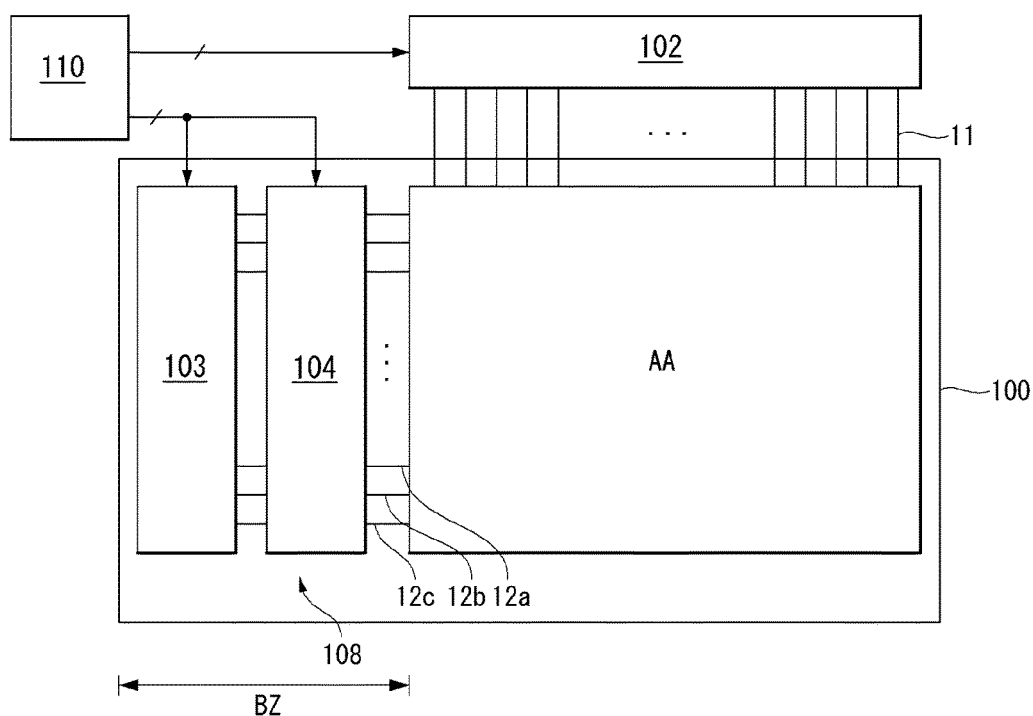
FIG. 1 is a block diagram of an electroluminescent display according to an embodiment of the disclosure.

Reference will now be made in detail to embodiments of the present disclosure, examples of which are illustrated in the accompanying drawings. However, the present disclosure is not limited to embodiments disclosed below, and may be implemented in various forms. These embodiments are provided so that the present disclosure will be exhaustively and completely described, and will fully convey the scope of the present disclosure to those skilled in the art to which the present disclosure pertains. The present disclosure is only defined by the scope of the claims.

Shapes, sizes, ratios, angles, number, and the like illustrated in the drawings for describing embodiments of the present disclosure are merely exemplary, and the present disclosure is not limited thereto. Like reference numerals designate like elements throughout. In the following description, when a detailed description of well-known functions or configurations related to this document is determined to unnecessarily cloud a gist of the invention, the detailed description thereof will be omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component without departing from the scope of the present invention.

The features of various embodiments of the present disclosure can be partially combined or entirely combined with each other, and can be technically interlocking-driven in various ways. The embodiments can be independently implemented, or can be implemented in conjunction with each other.

In embodiments of the disclosure, a gate driver may be directly formed on a substrate of a display panel. Transistors constituting a pixel circuit and the gate driver may be implemented as thin film transistors (TFTs) of n-type or p-type metal oxide semiconductor field effect transistor (MOSFET) structure. Each TFT (or each transistor) is a three-electrode element including a gate, a source, and a drain. The source is an electrode for supplying carriers to the TFT. The carriers inside the TFT begin to flow from the source. The drain is an electrode from which the carriers exit the TFT. Namely, carriers in the MOSFET flow from the source to the drain. In the case of an n-type TFT (or an n-type MOSFET (NMOS)), because carriers are electrons, a source voltage is less than a drain voltage so that electrons can flow from a source to a drain. In the n-type TFT, because electrons flow from the source to the drain, a current flows from the drain to the source. In the case of a p-type TFT (or a p-type MOSFET (PMOS)), because carriers are holes, a source voltage is greater than a drain voltage so that holes can flow from a source to a drain. In the p-type TFT, because holes flow from the source to the drain, a current flows from the source to the drain. It should be noted that the source and the drain of the TFT are not fixed. For example, the source and the drain of the TFT may be changed depending on an applied voltage. In the following embodiments of the disclosure, the source and the drain of the TFT may be referred to as a first electrode and a second electrode. In other words, embodiments of the disclosure are not limited by the source and the drain of the TFT.

The transistors constituting the pixel circuit and the gate driver according to an embodiment of the disclosure may include at least one of an oxide TFT, an amorphous silicon (a-Si) TFT, and a low temperature polysilicon (LTPS) TFT.

In the following description, a gate-on voltage is a voltage of a gate signal capable of turning on a TFT, and a gate-off voltage is a voltage of the gate signal capable of turning off a TFT. In the PMOS, the gate-on voltage is a gate low voltage VGL, and the gate-off voltage is a gate high voltage VGH. In the NMOS, the gate-on voltage is a gate high voltage VGH, and the gate-off voltage is a gate low voltage VGL.

Each pixel circuit according to an embodiment of the disclosure includes an electroluminescent diode driven by a source-to-gate voltage Vsg or a gate-to-source voltage Vgs of a driving TFT. In the following embodiments of the disclosure, an organic light emitting diode (OLED) is described as an example of the electroluminescent diode. However, embodiments are not limited thereto.

In the following embodiments of the disclosure, an organic light emitting diode (OLED) display is described as an example of an electroluminescent display. However, embodiments are not limited thereto. For example, an inorganic light emitting diode display including an inorganic light emitting material may be used. In addition, a quantum dot display may be used.

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure.

Referring to FIG. 1, an electroluminescent display according to an embodiment of the disclosure includes a display panel 100, a data driver 102, a gate driver 108, and a timing controller 110. The gate driver 108 includes a scan driver 103 and an emission driver 104.

The display panel 100 includes a plurality of data lines 11 and a plurality of gate lines that intersect each other, and pixels. A screen display unit AA of the display panel 100 displays data of an input image on a pixel array. The display panel 100 further includes power supply lines commonly connected to adjacent pixels. The power supply lines includes VDD lines supplying a high potential driving voltage VDD (e.g., a first supply voltage) to the pixels and Vref lines supplying a reference voltage Vref less than the VDD to the pixels.

Figure 2:
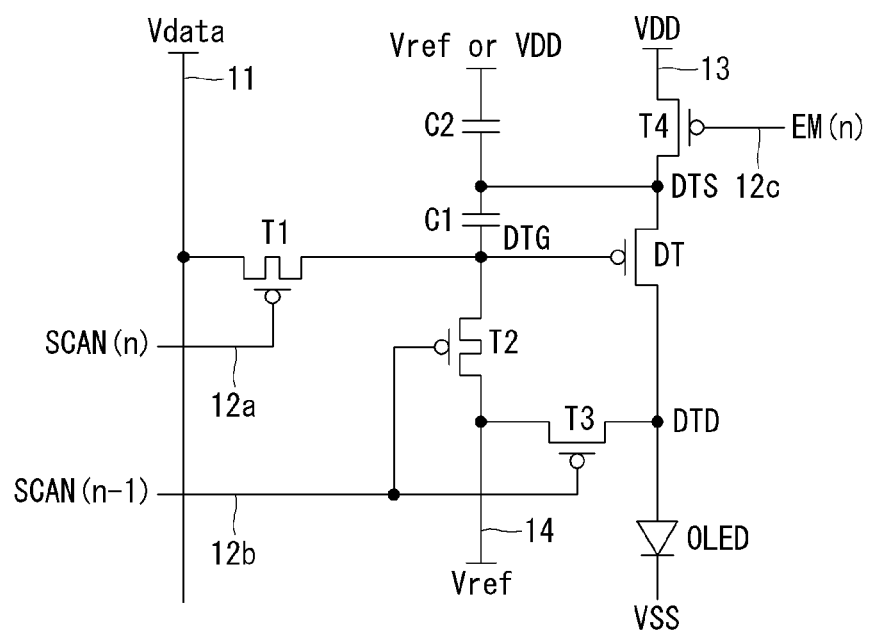
FIG. 2 is a circuit diagram of a pixel circuit according to a first embodiment of the disclosure.

Referring to FIG. 2, the gate lines include a plurality of scan lines 12a and 12b supplied with scan signals SCAN(n−1) and SCAN(n) and a plurality of emission control signal lines (hereinafter referred to as "EM signal lines") 12c supplied with an emission control signal (hereinafter referred to as "EM signal") EM(n).

Each pixel includes a red subpixel, a green subpixel, and a blue subpixel for the color representation. Each pixel may further include a white subpixel. Each subpixel includes a pixel circuit illustrated in FIGS. 2 to 25.

Figure 3:
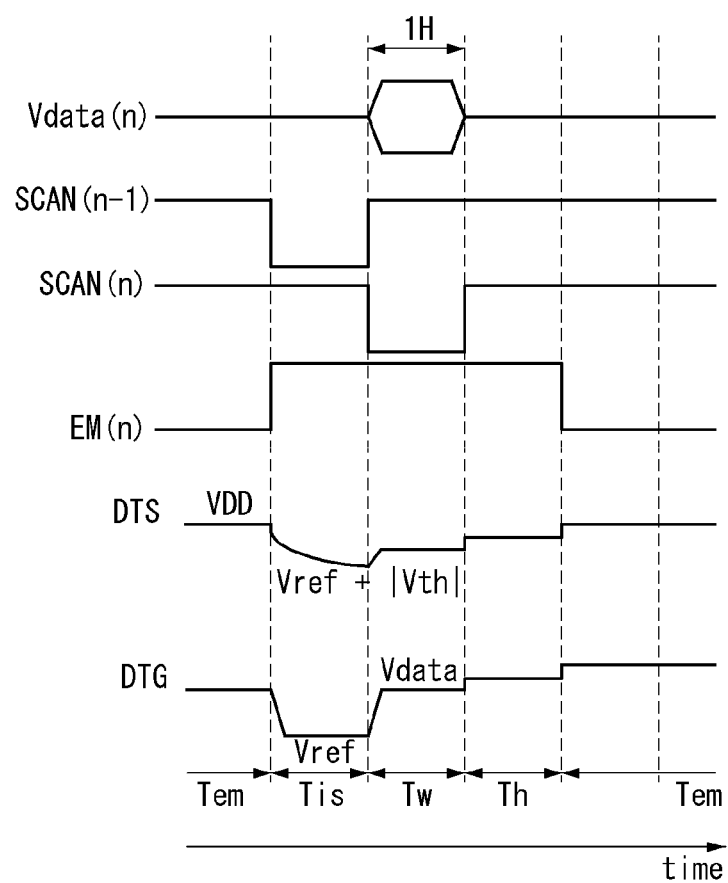
FIG. 3 is a waveform diagram illustrating an operation of a pixel circuit shown in FIG. 2.

One frame period includes a scan period, in which data is addressed to the pixels at each of display lines connected to the pixels and data of an input image is written to each pixel, and an emission period Tem, in which the pixels are repeatedly turned on and off in response to the EM signal EM(n) after the scan period. As shown in FIG. 3, the scan period includes an initialization and sampling period Tis and a pixel driving voltage setting period Tw. The scan period may further include a hold period Th, but the hold period Th may be minimized or omitted. During the scan period, an initialization of the pixel circuit, a compensation for a threshold voltage of a driving TFT, charging of a data voltage to a driving TFT, and an emission operation of the pixels are performed. Because the scan period, in which data is addressed to the pixels, is only about one horizontal period, most of one frame period is the emission period Tem. The pixels are charged with the data voltage in the scan period. The pixels display data at the same luminance using the data voltage previously charged in pixels during one frame period while repeating a turn-on operation and a turn-off operation in response to the EM signal EM(n) without additionally receiving the data voltage during the emission period Tem following the scan period.

Referring to FIG. 1, the data driver 102 converts data of an input image received from the timing controller 110 into a gamma compensation voltage under the control of the timing controller 110 and generates a data voltage Vdata. The data driver 102 outputs the data voltage Vdata to the data lines 11. The data voltage Vdata is supplied to the pixels through the data lines 11.

Referring to FIGS. 1 to 3, the scan driver 103 sequentially supplies the scan signals SCAN(n−1) and SCAN(n) to the scan lines 12a and 12b under the control of the timing controller 110. The (n−1)th scan signal SCAN(n−1) applied to a (n−1)th display line is synchronized with a (n−1)th data voltage, where n is a positive integer. The nth scan signal SCAN(n) applied to an nth display line is synchronized with an nth data voltage Vdata(n). In this instance, the (n−1)th display line is connected to (n−1)th subpixels, and the nth display line is connected to nth subpixels. Because the (n−1)th scan signal SCAN(n−1) and the nth scan signal SCAN(n) are applied to the nth display line, two scan lines share one output terminal of the scan driver 103. Hence, the number of output terminals of the scan driver 103 can be reduced. When the number of output terminals of the scan driver 103 is reduced as described above, an area occupied by the gate driver 108 decreases. A size of a bezel area BZ corresponding to a non-display area can be reduced by a decreased size of the occupied area of the gate driver 108.

The emission driver 104 generates the EM signal EM(n) under the control of the timing controller 110. The emission driver 104 sequentially supplies the EM signal EM(n) to the EM signal lines 12c. As shown in FIG. 3, an off-level pulse of the EM signal EM(n) is synchronized with on-level pulses of the (n−1)th and nth scan signals SCAN(n−1) and SCAN(n) and a (n+1)th scan signal, and overlaps the on-level pulses of the (n−1)th, nth, and (n+1)th scan signals. A voltage of the on-level pulse is generated as a gate-on voltage, and a voltage of the off-level pulse is generated as a gate-off voltage. The timing controller 110 receives digital video data of an input image and a timing signal synchronized with the digital video data from a host system. The timing signal includes a vertical sync signal Vsync, a horizontal sync signal Hsync, a clock signal CLK, a data enable signal DE, and the like. The host system may be one of a television system, a set-top box, a navigation system, a DVD player, a Blu-ray player, a personal computer (PC), a home theater system, a mobile information device, and other systems that include or operate in conjunction with a display.

The timing controller 110 generates a data timing control signal for controlling operation timing of the data driver 102 and a gate timing control signal for controlling operation timing of the gate driver 108 based on the timing signal received from the host system. The gate timing control signal includes a start pulse, a shift clock, and the like. The start pulse may define a start timing at which a first output is generated by each of shift registers of the scan driver 103 and the emission driver 104. For example, the shift register starts to be driven when the start pulse is input, and generates a first output signal at a first clock timing. The shift clock controls an output shift timing of the shift register.

FIGS. 2 and 3 are an equivalent circuit diagram and a waveform diagram illustrating an example of a pixel circuit according to one embodiment. A pixel circuit 20 shown in FIG. 2 exemplifies an nth pixel circuit that is disposed on an nth display line of the screen display unit AA and generates a current corresponding to an nth data voltage.

Referring to FIGS. 2 and 3, each pixel circuit 20 includes an OLED, a plurality of TFTs DT, T1, T2, T3, and T4, first and second capacitors C1 and C2, and the like. In the embodiment of the disclosure, the TFTs are implemented as PMOS transistors by way of example. The pixel circuit 20 is described below with reference to FIG. 1 as well as FIGS. 2 and 3.

The pixel circuit 20 includes an internal compensation circuit automatically sensing a threshold voltage of the driving TFT DT. Because the switching TFTs T1 to T4 and the first and second capacitors C1 and C2 required in the internal compensation circuit occupy a relatively small area, the embodiment of the disclosure can constitute the pixel circuit 20 at a compact layout structure. Hence, embodiments of the disclosure can implement a high resolution display device with high PPI (pixels per inch) having the small unit pixel size.

A pixel power, such as a high potential driving voltage VDD (e.g., a first supply voltage), a low potential power voltage VSS (e.g., a second supply voltage), and a reference voltage Vref, is applied to an nth pixel circuit 20. The high potential driving voltage VDD may be a DC voltage of 7V to 8V, the low potential power voltage VSS may be a DC voltage of 0V, and the reference voltage Vref may be a DC voltage of 1V. However, embodiments are not limited thereto. And, a pixel driving signal, such as a (n−1)th scan signal SCAN(n−1), an nth scan signal SCAN(n), and a data voltage Vdata, is applied to the nth pixel circuit 20.

The scan signals SCAN(n−1) and SCAN(n) are supplied to the scan lines 12a and 12b by the scan driver 103. An EM signal EM(n) is supplied to the EM signal lines 12c by the emission driver 104. The data voltage Vdata may be a voltage between 0V and 5V generated by the data driver 102, but embodiments are not limited thereto. Each of the scan signals SCAN(n−1) and SCAN(n) is generated to have a pulse width of one horizontal period 1H and swings between the VGH and the VGL. In the embodiment of the disclosure, the TFTs DT and T1 to T4 are implemented as PMOS transistors by way of example. Therefore, the gate-on voltage is the VGL, and the gate-off voltage is the VGH. For example, the VGH may be about 10V, and the VGL may be about −6V. However, embodiments are not limited thereto.

Referring to FIG. 3, the nth scan signal SCAN(n) synchronized with the nth data voltage Vdata(n) is supplied to the nth pixel circuit 20 subsequent to the (n−1)th scan signal SCAN(n−1). An operation of the pixel circuit 20 may be dividedly performed in an initialization and sampling period Tis, a pixel driving voltage setting period Tw, and an emission period Tem. An on-level pulse of the (n−1)th scan signal SCAN(n−1) is input to the nth pixel circuit 20 during the initialization and sampling period Tis, and the (n−1)th scan signal SCAN(n−1) is held at the gate-off voltage during a remaining period except the initialization and sampling period Tis. An on-level pulse of the nth scan signal SCAN(n) is input to the nth pixel circuit 20 during the pixel driving voltage setting period Tw, and the nth scan signal SCAN(n) is held at the gate-off voltage during a remaining period except the pixel driving voltage setting period Tw. An off-level pulse of the EM signal EM(n) is generated as the gate-off voltage during about three horizontal periods overlapping the (n−1)th and nth scan signals SCAN(n−1) and SCAN(n). A voltage of the EM signal EM(n) is inverted between the gate-on voltage and the gate-off voltage at a predetermined pulse width modulation (PWM) duty ratio during the emission period Tem and switches on and off a current of the OLED.

The OLED emits light using an amount of current, that is adjusted by the driving TFT DT depending on the data voltage Vdata, and represents a luminance corresponding to a grayscale of data of an input image. The VDD of 7V to 8V, the VSS of 0V, the Vref of 1V, and the Vdata of 0V to 5V may be applied to the pixel circuit 20 illustrated in FIGS. 2 and 3. As the data voltage Vdata decreases, a source-to-gate voltage Vsg of the driving TFT DT increases. Hence, a luminance of the pixel increases. When the source-to-gate voltage Vsg of the driving TFT DT increases, an emission amount of the OLED increases because the current of the OLED increases. Thus, in the pixel circuit 20 illustrated in FIGS. 2 and 3, the luminance of the pixel increases as the data voltage Vdata decreases, and the luminance of the pixel decreases as the data voltage Vdata increases.

A current path of the OLED is switched on and off by the fourth switching TFT T4 that is controlled in response to the EM signal EM(n). The OLED includes an anode, a cathode, and an organic compound layer between the anode and the cathode. The organic compound layer may include an emission layer EML and at least one of a hole injection layer HIL, a hole transport layer HTL, an electron transport layer ETL, and an electron injection layer EIL. However, embodiments are note limited thereto. Referring to FIG. 2, the anode of the OLED is connected to a drain of the driving TFT DT via a third node DTD, and the cathode of the OLED is connected to a VSS electrode supplied with the VSS.

The driving TFT DT is a driving element for controlling a current Ioled flowing in the OLED depending on the source-to-gate voltage Vsg of the driving TFT DT. The driving TFT DT includes a gate connected to a first node DTG, a source connected to a second node DTS, and the drain connected to the third node DTD.

The first capacitor C1 is connected between the first node DTG and the second node DTS. The second capacitor C2 includes a first electrode receiving a voltage from a VDD line 13 or a Vref line 14 and a second electrode connected to the second node DTS.

A switching circuit (for example, the first to fourth switching TFTs T1 to T4) of the pixel circuit 20 supplies the reference voltage Vref to the gate and the drain of the driving TFT DT in response to the on-level pulse of the (n−1)th scan signal SCAN(n−1) and then supplies the data voltage Vdata (n) to the gate of the driving TFT DT in response to the on-level pulse of the nth scan signal SCAN(n). And, the switching circuit supplies the high potential driving voltage VDD greater than the reference voltage Vref to the source of the driving TFT DT in response to the gate-on voltage after the off-level pulse of the EM signal EM(n).

The first switching TFT T1 is a switching element for supplying a first voltage to the first node DTG in response to the nth scan signal SCAN(n). The first voltage is the data voltage Vdata(n) synchronized with the nth scan signal SCAN(n). The first switching TFT T1 includes a gate connected to the first scan line 12a, a drain connected to the data line 11, and a source connected to the first node DTG. The nth scan signal SCAN(n) is generated as the gate-on voltage during the pixel driving voltage setting period Tw and is supplied to the nth pixel circuit 20 via the first scan line 12a.

The second switching TFT T2 is a switching element for supplying a second voltage to the first node DTG in response to the (n−1)th scan signal SCAN(n−1). The second voltage is the reference voltage Vref that is greater than the VSS and less than the VDD. The on-level pulse of the (n−1)th scan signal SCAN(n−1) is earlier than the on-level pulse of the nth scan signal SCAN(n). The second switching TFT T2 includes a gate connected to the second scan line 12b, a source connected to the Vref line 14, and a drain connected to the first node DTG. The (n−1)th scan signal SCAN(n−1) is supplied to the nth pixel circuit 20 through the second scan line 12b. At the same time, the (n−1)th scan signal SCAN (n−1) is synchronized with the (n−1)th data voltage and may be supplied to a (n−1)th pixel circuit 20 disposed on the (n−1)th display line of the screen display unit AA. The (n−1)th scan signal SCAN(n−1) is supplied to the nth pixel circuit 20 as the gate-on voltage during the initialization and sampling period Tis.

The third switching TFT T3 is a switching element for supplying the reference voltage Vref to the third node DTD in response to the (n−1)th scan signal SCAN(n−1). The third switching TFT T3 includes a gate connected to the second scan line 12b, a source connected to the Vref line 14, and a drain connected to the third node DTD.

The fourth switching TFT T4 is a switching element for switching on and off the current flowing in the OLED in response to the EM signal EM(n). The fourth switching TFT T4 includes a gate connected to the EM signal line 12c, a source connected to the VDD line 13, and a drain connected to the second node DTS. The EM signal EM(n) is supplied to the nth pixel circuit 20 via the EM signal line 12c.

An operation of the pixel circuit 20 is described below with reference to FIGS. 4 to 7.

As shown in FIG. 4, during the emission period Tem prior to the initialization and sampling period Tis, the EM signal EM(n) is generated as the gate-on voltage, and the fourth switch TFT T4 is turned on. In this instance, the fourth switching TFT T4 and the driving TFT DT are turned on, and the first to third switching TFTs T1, T2, and T3 maintain an off-state. Hence, the current Ioled flows in the OLED, and a voltage of the second node DTS is set to the VDD.

Referring to FIG. 5, when the initialization and sampling period Tis starts, a voltage of the (n−1)th scan signal SCAN(n−1) is inverted to the gate-on voltage, and a voltage of the EM signal EM(n) is inverted to the gate-off voltage. During the initialization and sampling period Tis, a voltage of the nth scan signal SCAN(n) is held at the gate-off voltage. During the initialization and sampling period Tis, the second and third switching TFTs T2 and T3 are turned on in response to the on-level pulse of the (n−1)th scan signal SCAN(n−1), and the reference voltage Vref is applied to the first and third nodes DTG and DTD through the second and third switching TFTs T2 and T3. Thus, during the initialization and sampling period Tis, voltages of the first and third nodes DTG and DTD are initialized to the reference voltage Vref. Because a voltage of Vref+|Vth| is applied to the second node DTS during the initialization and sampling period Tis, a threshold voltage Vth of the driving TFT DT is stored in the first capacitor C1. Thus, during the initialization and sampling period Tis, the threshold voltage Vth of the driving TFT DT is sensed.

Because the fourth switching TFT T4 is turned off during the initialization and sampling period Tis, the VDD and the Vref are not short-circuited in the pixel circuit 20. Thus, an increase in power consumption, the deterioration of the pixels, and a reduction in the reliability resulting from the short circuit of the VDD and the Vref in the pixel circuit 20 can be minimized or prevented.

During the initialization and sampling period Tis, when the VDD is applied to one electrode of the second capacitor C2, a voltage of the second capacitor C2 is |Vref+|Vth|−VDD|. And, when the Vref is applied to one electrode of the second capacitor C2, a voltage of the second capacitor C2 is |Vref+|Vth|−Vref|=|Vth|. During the initialization and sampling period Tis, a change in VDD is reflected both at the node DTG and the node DTS.

The pixel circuit 20 operates in the pixel driving voltage setting period Tw subsequent to the initialization and sampling period Tis. As shown in FIG. 6, when the pixel driving voltage setting period Tw starts, a voltage of the nth scan signal SCAN(n) is inverted to the gate-on voltage, and a voltage of the (n−1)th scan signal SCAN(n−1) is inverted to the gate-off voltage. During the pixel driving voltage setting period Tw, a voltage of the EM signal EM(n) is held at the gate-off voltage. During the pixel driving voltage setting period Tw (i.e., during one horizontal period 1H), the first switching TFT T1 is turned on in response to the on-level pulse of the nth scan signal SCAN(n) and applies the data voltage Vdata to the first node DTG. During the pixel driving voltage setting period Tw, the remaining TFTs T2 to T4 and DT except the first switching TFT T1 are turned off. During the pixel driving voltage setting period Tw, the first node DTG is charged with the data voltage Vdata. During the pixel driving voltage setting period Tw, a voltage of the second node DTS is changed to $$Vref + |Vth| + \left(\frac{C1}{C1+C2}\right)(Vdata - Vref)$$

due to the coupling through the first capacitor C1.

During the pixel driving voltage setting period Tw, when the VDD is applied to one electrode of the second capacitor C2, a voltage of the second capacitor C2 is $$Vref + |Vth| + \left(\frac{C1}{C1+C2}\right)(Vdata - Vref) - VDD.$$

And, when the Vref is applied to one electrode of the second capacitor C2, a voltage of the second capacitor C2 is $$Vref + |Vth| + \left(\frac{C1}{C1+C2}\right)(Vdata - Vref) - Vref =$$
$$|Vth| + \left(\frac{C1}{C1+C2}\right)(Vdata - Vref).$$

During the hold period Th subsequent to the pixel driving voltage setting period Tw, a voltage of the nth scan signal SCAN(n) is inverted to the gate-off voltage, and voltages of the (n−1)th scan signal SCAN(n−1) and the EM signal EM(n) are maintained at a previous level. During the hold period Th, voltages of the first and second nodes DTG and DTS may be changed by a kickback voltage generated when the voltage of the nth scan signal SCAN(n) is changed to the gate-off voltage.

As shown in FIG. 7, when the emission period Tem starts after the hold period Th, the scan signals SCAN(n−1) and SCAN(n) are held at the gate-off voltage, and the EM signal EM(n) is inverted to the gate-on voltage. In this instance, a voltage of the second node DTS is changed to the VDD, and a voltage of the first node DTG (i.e., a gate voltage of the driving TFT DT) is changed to $$Vdata + VDD - \left\{ Vref + |Vth| + \left(\frac{C1}{C1+C2}\right)(Vdata - Vref)\right\}.$$

Hence, the source-to-gate voltage Vsg of the driving TFT DT determining a current amount (e.g., a magnitude) of the OLED is set. In this instance, a current Ioled represented by the following Equation 1 flows in the OLED.

$$Ioled = K(Vsg - |Vth|)^2 = \qquad \text{[Equation 1]}$$
$$K\left(VDD - \left\{\begin{array}{c}Vdata + VDD - Vref - |Vth| - \\ \left(\frac{C1}{C1+C2}\right)(Vdata - Vref)\end{array}\right\} - |Vth|\right)^2 =$$
$$K\left\{\left(\frac{C2}{C1+C2}\right)(Vref - Vdata)\right\}^2$$

where K is a constant determined by mobility, a parasitic capacitance, a channel capacity, etc. of the driving TFT DT, and Vth is a threshold voltage of the driving TFT DT.

As can be seen from the above Equation 1, the current Ioled of the OLED in the embodiment of the disclosure is not affected by VDD as a change in the first supply voltage is reflected both at node DTG and node DTS during the emission period where the OLED emits light. When the non-uniformity of the image quality is generated by a voltage drop of the VDD line, a resistance of the VDD line may decrease by forming the VDD lines in a mesh shape. However, in case of a display panel with high resolution, because a width of a VDD line has to decrease due to a decrease in an area corresponding to pixels, there is a limit to a reduction in a resistance of the VDD line. And, in case of a large-screen display panel, because a power supply path is lengthened to the inside of the screen display unit AA, a resistance of the VDD line increases. Thus, the embodiment of the disclosure can uniformize the luminance and the color of the pixels over the entire screen without designing the VDD lines at a low resistance or forming the VDD lines in the mesh shape because the current of the OLED is not affected by the VDD. Hence, the embodiment of the disclosure can implement the uniform image quality of a display panel with high resolution having the small pixel size. And, the embodiment of the disclosure can provide a large-screen display panel having the improved luminance and image quality. Because the embodiment of the disclosure can compensate for the voltage drop of the VDD line, the embodiment of the disclosure can achieve the above effects without forming the VDD lines in the mesh shape.

During the emission period Tem, the voltage of the first node DTG is Vdata+

$$VDD - \left[ Vref + |Vth| + \left( \frac{C1}{C1 + C2} \right)(Vdata - Vref) \right],$$

and the voltage of the second node DTS is the VDD. Therefore, a voltage of the first capacitor C1 storing a voltage difference between the first node DTG and the second node DTS is $$\left| \left( \frac{C2}{C1 + C2} \right)(Vdata - Vref) - |Vth| \right|.$$

During the emission period Tem, when the VDD is applied to one electrode of the second capacitor C2, a voltage of the second capacitor C2 is |VDD−VDD|=0V. And, when the Vref is applied to one electrode of the second capacitor C2, a voltage of the second capacitor C2 is |VDD−Vref|.

As can be seen from FIGS. 2 to 7, the embodiment of the disclosure can control a time (i.e., a time between the emission period Tem and the pixel driving voltage setting period Tw), for which the anode of the OLED is floated during an off-period of the EM signal EM(n) in the pixel circuit 20, to be a very short time interval, thereby minimizing an increase in a luminance of a black gray level or a reduction in a contrast ratio. Hence, the display quality can be improved. The black gray level is a minimum gray value, for example, 00000000$_{(2)}$ of pixel data. A luminance of the pixel at the black gray level may be a minimum luminance. Thus, because a time, for which the anode of the OLED is floated after the EM signal EM(n) is inverted to the gate-off voltage, may be set to a short time internal, the display quality of the electroluminescent display can be improved.

In Equation 1, $$\frac{C2}{C1 + C2}$$

is a gain or the data voltage Vdata. The gain may be properly selected in consideration of a voltage range of a driver IC into which the circuit of the data driver 102 is integrated, power consumption of the data driver 102, a grayscale representation capability, etc. In Equation 1, the gain is close to "1" as a value of C2 increases, and the gain is close to zero as the value of C2 decreases. The first capacitor C1 is a capacitor storing the source-to-gate voltage Vsg (or the gate-to-source voltage Vgs) of the driving TFT DT. As a capacitance of the first capacitor C1 increases, the first capacitor C1 has a stable voltage holding capability. However, the gain decreases. As the gain decreases, a data voltage range of the data driver 102 increases. An increase in the data voltage range of the data driver 102 may lead to an increase in the power consumption of the data driver 102. When the data voltage range of the data driver 102 increases as the gain decreases, the detailed grayscale representation can be performed. Thus, because the data voltage range of the data driver 102 can be controlled depending on a capacitor ratio in the pixel, the detailed grayscale representation can be performed. In embodiments, the capacitor ratio may be a ratio of capacitances of the first and second capacitors C1 and C2.

Figure 8:
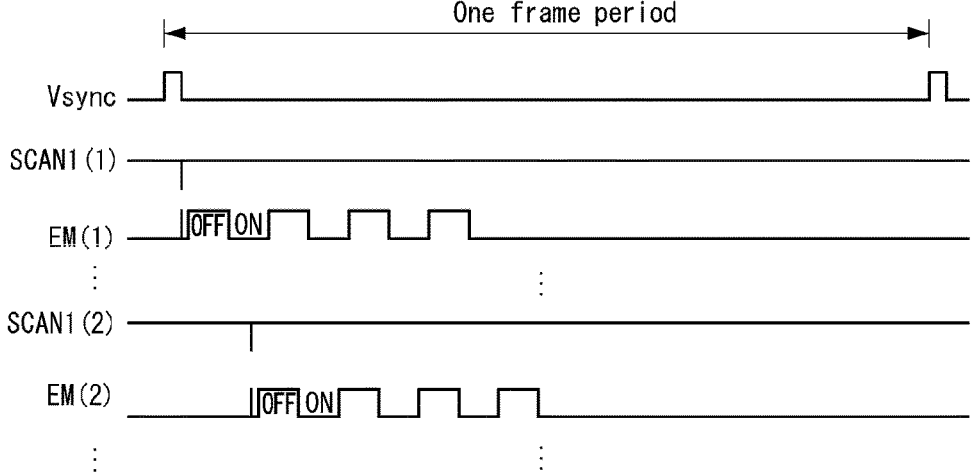
FIG. 8 is a waveform diagram illustrating an example where an EM signal is modified at a pulse width modulation (PWM) duty ratio equal to or less than 50% during an emission period of a pixel.

FIG. 8 is a waveform diagram illustrating an example where an EM signal is modified at a PWM duty ratio equal to or less than 50% during an emission period of a pixel.

In FIG. 8, "SCAN1(1)" and "EM(1)" are a first scan signal and a first EM signal applied to pixels arranged on a first display line of the display panel 100, respectively, and "SCAN1(2)" and "EM(2)" are a second scan signal and a second EM signal applied to pixels arranged on a second display line of the display panel 100, respectively. When the EM signal EM is switched on and off at a PWM duty ratio equal to or less than 50% during the emission period Tem after data is addressed to the pixels during a scan period, a flicker and image sticking can decrease. Hence, the image quality can be improved. And, because the Vsg of the driving TFT DT may be stored in the first capacitor C1 during the off-period of the EM signal EM in the emission period Tem, a stable duty drive can be performed without additionally writing data to the pixels.

Because the first and second switching TFTs T1 and T2 have the long off-period, they are weak to a leakage current. As shown in FIGS. 2 to 7, the first and second switching TFTs T1 and T2 may be transistors with a dual gate structure, in which there is a small leakage current, in consideration of this. If the first and second switching TFTs T1 and T2 are transistors having a very small leakage current, they may have a single gate structure. Transistors having a very small leakage current may be oxide transistors (oxide TFT).

FIG. 9 illustrates an example where a pulse width of a scan signal applied to a pixel circuit is extended.

Referring to FIG. 9, a pixel circuit 20 of FIG. 9 is substantially the same as the pixel circuit 20 shown in FIGS. 2 to 7, except that pulse widths of scan signals SCAN1 and SCAN2 are differently set from those shown in FIGS. 2 to 7. In FIG. 9, a pulse width of the second scan signal SCAN2 defining an initialization and sampling period Tis is differently set from a pulse width of the first scan signal SCAN1 synchronized with the data voltage Vdata. For example, FIG. 9 illustrates that a pulse width of the second scan signal SCAN2 is set to be longer in duration than a pulse width of the first scan signal SCAN1. However, embodiments are not limited thereto. The pulse width of the second scan signal SCAN2 may be adjusted in consideration of a resolution and panel characteristics.

Since an OLED, a driving TFT DT, capacitors C1 and C2, and a fourth switching TFT T4 included in the pixel circuit 20 of FIG. 9 are substantially the same as those described above, a further description may be briefly made or may be entirely omitted.

A first switching TFT T1 is a switching element for supplying the data voltage Vdata(n) to a first node DTG in response to the first scan signal SCAN1. The first switching TFT T1 includes a gate connected to a first scan line supplied with the first scan signal SCAN1, a drain connected to a data line 11, and a source connected to the first node DTG. The first scan signal SCAN1 is generated as a gate-on voltage during a pixel driving voltage setting period Tw of one frame period and is held as a gate-off voltage during a remaining period excluding the pixel driving voltage setting period Tw from the one frame period.

The second switching TFT T2 is a switching element for supplying a reference voltage Vref to the first node DTG in response to the second scan signal SCAN2. The second switching TFT T2 includes a gate connected to a second scan line supplied with the second scan signal SCAN2, a source connected to a Vref line 14, and a drain connected to the first node DTG. The second scan signal SCAN2 is generated as the gate-on voltage during an initialization and sampling period Tis prior to the pixel driving voltage setting period Tw and is held as a gate-off voltage during a remaining period excluding the initialization and sampling period Tis from the one frame period.

The third switching TFT T3 is a switching element for supplying the reference voltage Vref to a third node DTD in response to the second scan signal SCAN2. The third switching TFT T3 includes a gate connected to the second scan line supplied with the second scan signal SCAN2, a source connected to the Vref line 14, and a drain connected to the third node DTD.

Because one horizontal period 1H decreases as a resolution of a display panel increases, the one horizontal period 1H is insufficient to sense a threshold voltage Vth of the driving TFT DT. In this instance, if the pulse width of the separate second scan signal SCAN2 independent from the data voltage Vdata increases, a sensing time of the driving TFT DT can be sufficiently secured. Thus, the embodiment of the disclosure can sufficiently secure a compensation time of a display panel with high resolution.

Figure 10:
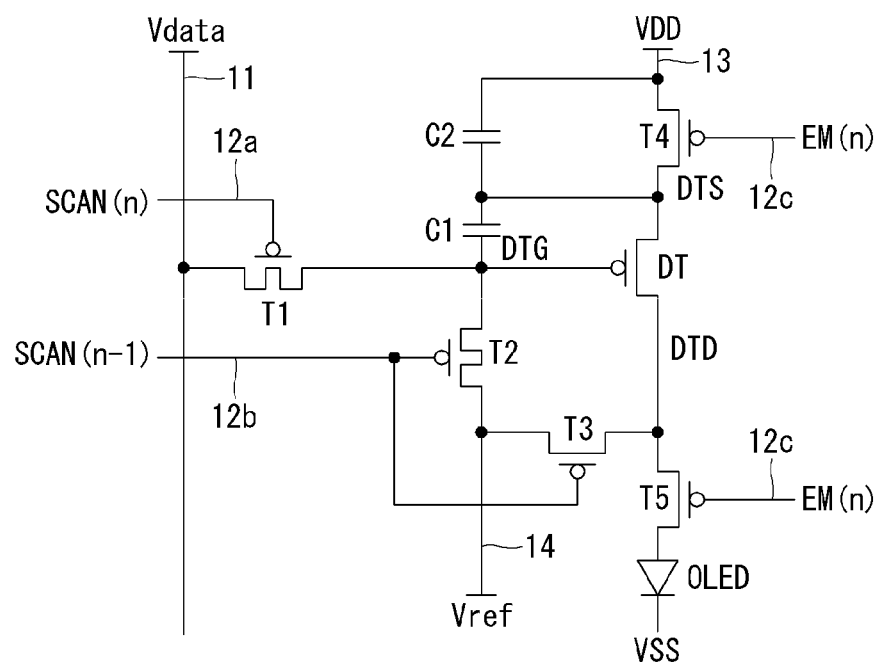
FIG. 10 is a circuit diagram illustrating an example where a fifth switching thin film transistor (TFT) is added to a pixel circuit shown in FIG. 2 according to one embodiment.

FIG. 10 is a circuit diagram illustrating an example where a fifth switching TFT is added to the pixel circuit shown in FIG. 2. Structures and components identical or equivalent to those illustrated in FIGS. 1 to 9 are designated with the same reference numerals in FIG. 10, and a further description may be briefly made or may be entirely omitted.

Referring to FIG. 10, a pixel circuit 30 includes a fifth switching TFT T5 between a third node DTD and an anode of an OLED. Since an OLED, a driving TFT DT, capacitors C1 and C2, and first to fourth switching TFTs T1 to T4 included in the pixel circuit 30 of FIG. 10 are substantially the same as those described above, a further description may be briefly made or may be entirely omitted.

The fifth switching TFT T5 cuts off a current path between the driving TFT DT and the OLED during an initialization and sampling period Tis, thereby preventing the OLED from unwillingly emitting light. When the OLED emits light during the initialization and sampling period Tis, a luminance of a black gray level may increase. Hence, a contrast ratio may be reduced. In particular, when the nodes DTG, DTS and DTD of the pixel circuit 30 are initialized during the initialization and sampling period Tis when the host system requires a high reference voltage Vref, a voltage of the anode of the OLED increases. Hence, a current may flow in the OLED, and the OLED may emit light. Namely, in order to prevent the OLED from emitting light in a remaining period excluding an emission period Tem from one frame period, the fifth switching TFT T5 cuts off a current path connected to the OLED in response to an EM signal EM(n) during the initialization and sampling period Tis and connects a current path between the driving TFT DT and the OLED during the emission period Tem.

The fifth switching TFT T5 is turned on and off at the same time as the fourth switching TFT T4 in response to the EM signal EM(n). The fifth switching TFT T5 includes a gate connected to an EM signal line 12c supplied with the EM signal EM(n), a source connected to the third node DTD, and a drain connected to the anode of the OLED.

The pixels may be driven in a direct gamma driving method in which a luminance of the pixels increases as the data voltage Vdata increases in accordance with the host system. In this instance, as shown in FIGS. 11 to 15, the direct gamma driving method can be implemented by reversing a data voltage application path and a reference voltage application path of the pixel circuit and increasing the reference voltage without changing the above-described pixel circuits 20 and 30.

FIGS. 11 to 15 illustrate a pixel circuit and a method of driving the same according to a second embodiment of the disclosure. A pixel circuit 40 shown in FIGS. 11 to 15 illustrates an example where a data voltage application path and a reference voltage application path are reversed in the pixel circuit 20 shown in FIGS. 2 to 7. Although not shown, an example where a data voltage application path and a reference voltage application path are reversed in the pixel circuit 30 shown in FIG. 10 may be used in the pixel circuit 40 shown in FIGS. 11 to 15.

Figure 11:
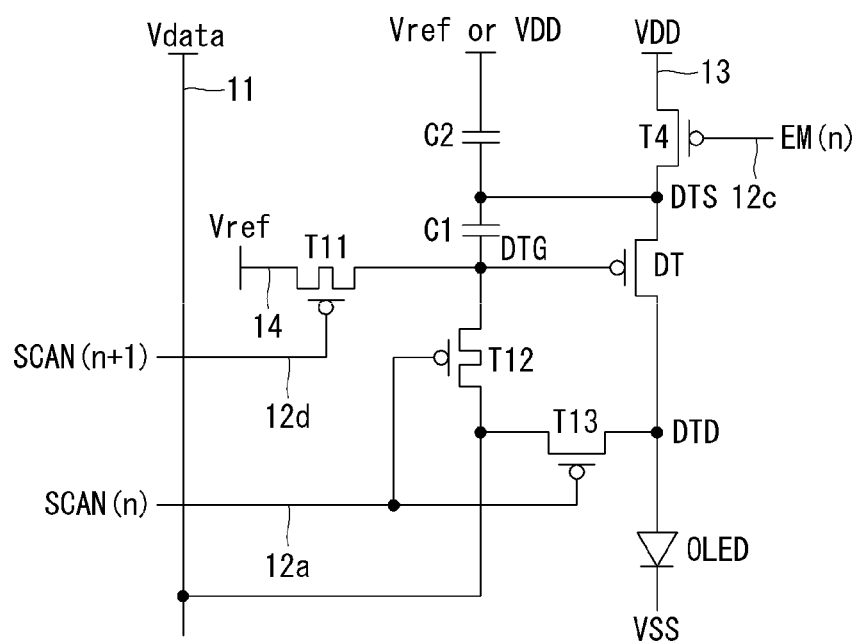

Referring to FIG. 11, each pixel circuit 40 includes an OLED, a plurality of TFTs DT, T11, T12, T13 and T4, first and second capacitors C1 and C2, and the like.

A pixel power, such as a high potential driving voltage VDD, a low potential power voltage VSS, and a reference voltage Vref, is applied to an nth pixel circuit 40. The high potential driving voltage VDD may be a DC voltage of 7V to 8V, the low potential power voltage VSS may be a DC voltage of 0V, and the reference voltage Vref may be a DC voltage of 4V to 5V. However, embodiments are not limited thereto. And, a pixel driving signal, such as an nth scan signal SCAN(n), a (n+1)th scan signal SCAN(n+1), and a data voltage Vdata, is applied to the nth pixel circuit 40.

The scan signals SCAN(n) and SCAN(n+1) are supplied to scan lines 12a and 12d by a scan driver 103. An EM signal EM(n) is supplied to EM signal lines 12c by an emission driver 104. The data voltage Vdata may be a voltage between 0V and 5V generated by a data driver 102, but embodiments are not limited thereto. Each of the scan signals SCAN(n) and SCAN(n+1) is generated to have a pulse width of one horizontal period 1H and swings between the VGH and the VGL. In the embodiment of the disclosure, the TFTs DT, T11, T12, T13 and T4 are implemented as PMOS transistors by way of example. Therefore, a gate-on voltage is the VGL, and a gate-off voltage is the VGH. The VGH may be about 10V, and the VGL may be about −6V. However, embodiments are not limited thereto.

An operation of the pixel circuit 40 shown in FIG. 11 may be dividedly performed in an initialization and sampling period Tis, a pixel driving voltage setting period Tw, and an emission period Tem. A hold period Th may exist between the pixel driving voltage setting period Tw and the emission period Tem, but may be omitted. An on-level pulse of the nth scan signal SCAN(n) is input to the nth pixel circuit 40 during the initialization and sampling period Tis, and the nth scan signal SCAN(n) is held at the gate-off voltage during a remaining period except the initialization and sampling period Tis. An on-level pulse of the (n+1)th scan signal SCAN(n+1) is input to the nth pixel circuit 40 during the pixel driving voltage setting period Tw, and the (n+1)th scan signal SCAN(n+1) is held at the gate-off voltage during a remaining period except the pixel driving voltage setting period Tw. An off-level pulse of the EM signal EM(n) is generated as the gate-off voltage during about three horizontal periods overlapping the nth and (n+1)th scan signals SCAN(n) and SCAN(n+1). A voltage of the EM signal EM(n) is inverted between the gate-on voltage and the gate-off voltage at a predetermined PWM duty ratio during the emission period Tem and switches on and off a current of the OLED.

The OLED emits light using an amount of current, that is adjusted by the driving TFT DT depending on the data voltage Vdata, and represents a luminance corresponding to a grayscale of data of an input image. The VDD of 7V to 8V, the VSS of 0V, the Vref of 4V to 5V, and the Vdata of 0V to 5V may be applied to the pixel circuit 40 illustrated in FIGS. 11 to 15. As the data voltage Vdata increases, a source-to-gate voltage Vsg of the driving TFT DT increases. Hence, a luminance of the pixel increases. When the source-to-gate voltage Vsg of the driving TFT DT increases, an emission amount of the OLED increases because the current of the OLED increases. Thus, in the pixel circuit 40 illustrated in FIGS. 11 to 15, the luminance of the pixel increases as the data voltage Vdata increases, and the luminance of the pixel decreases as the data voltage Vdata decreases.

The pixel circuit 40 shown in FIGS. 11 to 15 according to the second embodiment has substantially the same circuit structure as the pixel circuits 20 and 30 according to the first embodiment, except that a switching TFT supplied with the data voltage and a switching TFT supplied with the reference voltage are reversed. Structures and components identical or equivalent to those described in the first embodiment are designated with the same reference numerals in the second embodiment, and a further description may be briefly made or may be entirely omitted. The OLED, the driving TFT DT, the fourth switching TFT T4, and the first and second capacitors C1 and C2 included in the pixel circuit 40 have substantially the same connection relationship as those described in the first embodiment.

The first switching TFT T11 is a switching element for supplying a first voltage to a first node DTG in response to the (n+1)th scan signal SCAN(n+1). The first voltage is the reference voltage Vref that is greater than the VSS and less than the VDD. The on-level pulse of the (n+1)th scan signal SCAN(n+1) is later than the on-level pulse of the nth scan signal SCAN(n). The first switching TFT T11 includes a gate connected to a second scan line 12d, a source connected to a Vref line 14, and a drain connected to the first node DTG. The (n+1)th scan signal SCAN(n+1) is generated as the gate-on voltage during the pixel driving voltage setting period Tw and is supplied to the nth pixel circuit 40 via the second scan line 12d.

The second switching TFT T12 is a switching element for supplying a second voltage to the first node DTG in response to the nth scan signal SCAN(n) synchronized with the data voltage Vdata. The second voltage is the data voltage Vdata. The second switching TFT T12 includes a gate connected to a first scan line 12a, a source connected to a data line 11, and a drain connected to the first node DTG. The nth scan signal SCAN(n) is generated as the gate-on voltage during the initialization and sampling period Tis and is supplied to the nth pixel circuit 40 via the first scan line 12a.

The third switching TFT T13 is a switching element for supplying the data voltage Vdata to a third node DTD in response to the nth scan signal SCAN(n) synchronized with the data voltage Vdata. The third switching TFT T13 includes a gate connected to the first scan line 12a, a source connected to the data line 11, and a drain connected to the third node DTD.

A method of driving the pixel circuit 40 shown in FIG. 11 is described with reference to FIGS. 12 to 15.

As shown in FIG. 12, during the emission period Tem prior to the initialization and sampling period Tis, the EM signal EM(n) is generated as the gate-on voltage, and the fourth switch TFT T4 is turned on. In this instance, the fourth switching TFT T4 and the driving TFT DT are turned on, and the first to third switching TFTs T11, T12, and T13 maintain an off-state. Hence, a current Ioled flows in the OLED, and a voltage of a second node DTS is set to the VDD.

Referring to FIG. 13, during the initialization and sampling period Tis, a voltage of the nth scan signal SCAN(n) is inverted to the gate-on voltage, and a voltage of the EM signal EM(n) is inverted to the gate-off voltage. During the initialization and sampling period Tis, a voltage of the (n+1)th scan signal SCAN(n+1) is held at the gate-off voltage. During the initialization and sampling period Tis (i.e., one horizontal period 1H), the second and third switching TFTs T12 and T13 are turned on in response to the on-level pulse of the nth scan signal SCAN(n) synchronized with the data voltage Vdata(n), and the data voltage Vdata(n) is applied to the first and third nodes DTG and DTD through the second and third switching TFTs T12 and T13. Thus, during the initialization and sampling period Tis, voltages of the first and third nodes DTG and DTD are initialized to the data voltage Vdata(n). Because a voltage of Vdtata+|Vth| is applied to the second node DTS during the initialization and sampling period Tis, a threshold voltage Vth of the driving TFT DT is stored in the first capacitor C1. Thus, during the initialization and sampling period Tis, the threshold voltage Vth of the driving TFT DT is sensed.

Because the fourth switching TFT T4 is turned off during the initialization and sampling period Tis, the VDD and the Vref are not short-circuited in the pixel circuit 40. Thus, an increase in power consumption, the deterioration of the pixels, and a reduction in the reliability resulting from the short-circuit of the VDD and the Vref in the pixel circuit 40 can be minimized or prevented.

During the initialization and sampling period Tis, when the VDD is applied to one electrode of the second capacitor C2, a voltage of the second capacitor C2 is |Vdata+Vth−VDD|. And, when the Vref is applied to one electrode of the second capacitor C2, a voltage of the second capacitor C2 is |Vdata+|Vth|−Vref|.

The pixel circuit 40 operates in the pixel driving voltage setting period Tw subsequent to the initialization and sampling period Tis. As shown in FIG. 14, when the pixel driving voltage setting period Tw starts, a voltage of the (n+1)th scan signal SCAN(n+1) is inverted to the gate-on voltage, and a voltage of the nth scan signal SCAN(n) is inverted to the gate-off voltage. During the pixel driving voltage setting period Tw, a voltage of the EM signal EM(n) is held at the gate-off voltage. During the pixel driving voltage setting period Tw, the first switching TFT T11 is turned on in response to the on-level pulse of the (n+1)th scan signal SCAN(n+1) and applies the reference voltage Vref to the first node DTG. During the pixel driving voltage setting period Tw, the remaining TFTs, i.e., the second to fourth TFTs T12, T13 and T4 and the driving TFT DT except the first switching TFT T11 are turned off. During the pixel driving voltage setting period Tw, the first node DTG is charged with the reference voltage Vref. During the pixel driving voltage setting period Tw, a voltage of the second node DTS is changed to $$Vdata + |Vth| + \left(\frac{C1}{C1+C2}\right)(Vref - Vdata)$$

due to the coupling through the first capacitor C1.

During the pixel driving voltage setting period Tw, when the VDD is applied to one electrode of the second capacitor C2, a voltage of the second capacitor $$C2 \text{ is } Vdata + |Vth| + \left(\frac{C1}{C1+C2}\right)(Vref - Vdata) - VDD.$$

And, when the Vref is applied to one electrode of the second capacitor C2, a voltage of the second capacitor C2 is $$Vdata + |Vth| + \left(\frac{C1}{C1+C2}\right)(Vref - Vdata) - Vref.$$

During the hold period Th subsequent to the pixel driving voltage setting period Tw, a voltage of the (n+1)th scan signal SCAN(n+1) is inverted to the gate-off voltage, and voltages of the nth scan signal SCAN(n) and the EM signal EM(n) are maintained at a previous level. During the hold period Th, voltages of the first and second nodes DTG and DTS may be changed by a kickback voltage generated when the voltage of the (n+1)th scan signal SCAN(n+1) is changed to the gate-off voltage.

As shown in FIG. 15, when the emission period Tem starts after the hold period Th, the scan signals SCAN(n) and SCAN(n+1) are held at the gate-off voltage, and the EM signal EM(n) is inverted to the gate-on voltage. In this instance, a voltage of the second node DTS is changed to the VDD, and a voltage of the first node DTG (i.e., a gate voltage of the driving TFT DT) is changed to $$Vref + VDD - \left\{Vdata + |Vth| + \left(\frac{C1}{C1+C2}\right)(Vref - Vdata)\right\} =$$
$$VDD - |Vth| + \left(\frac{C2}{C1+C2}\right)(Vref - Vdata).$$

Hence, the source-to-gate voltage Vsg of the driving TFT DT determining a current amount of the OLED is set. In this instance, a current Ioled represented by the following Equation 2 flows in the OLED.

$$Ioled = K(Vsg - |Vth|)^2 \qquad \text{[Equation 2]}$$
$$= K\left(VDD - \left\{\frac{VDD - |Vth| +}{\left(\frac{C2}{C1+C2}\right)(Vref - Vdata)}\right\} - |Vth|\right)^2$$
$$= K\left\{\left(\frac{C2}{C1+C2}\right)(Vdata - Vref)\right\}^2$$

where K is a constant determined by mobility, a parasitic capacitance, a channel capacity, etc. of the driving TFT DT, and Vth is a threshold voltage of the driving TFT DT.

As can be seen from the above Equation 2, the current Ioled of the OLED in the embodiment of the disclosure is not affected by the VDD. When the non-uniformity of the image quality is generated by a voltage drop of the VDD line, a resistance of the VDD line may decrease by forming the VDD lines in a mesh shape. However, in case of a display panel with high resolution, because a width of a VDD line has to decrease due to a decrease in an area corresponding to pixels, there is a limit to a reduction in a resistance of the VDD line. And, in case of a large-screen display panel, because a power supply path is lengthened to the inside of a screen display unit AA, a resistance of the VDD line increases. Thus, the embodiment of the disclosure can uniformize the luminance and the color of the pixels over the entire screen without designing the VDD lines at a low resistance or forming the VDD lines in the mesh shape because the current of the OLED is not affected by the VDD. Hence, the embodiment of the disclosure can implement the uniform image quality of a display panel with high resolution having the small pixel size. And, the embodiment of the disclosure can provide a large-screen display panel having the improved luminance and image quality. Because the embodiment of the disclosure can compensate for the voltage drop of the VDD line, the embodiment of the disclosure can achieve the above effects without forming the VDD lines in the mesh shape.

As can be seen from the above Equation 2, the pixel circuit 40 shown in FIGS. 11 to 15 is driven in a direct gamma driving method in which a luminance of the pixels increases as the data voltage Vdata increases.

The pixel circuit 40 shown in FIGS. 11 to 15 is initialized to the data voltage Vdata that varies depending on the grayscale. The data voltage Vdata of a black gray level is a low voltage, for example, 0V. When an anode voltage of the OLED is initialized to the data voltage Vdata of the black gray level, the OLED cannot be turned on. Therefore, because a luminance of the pixel at the black gray level cannot increase, a reduction in a contrast ratio can be prevented. And, when an anode voltage of the OLED is initialized to the data voltage Vdata of a white gray level, the OLED may be turned on and the pixel may emit light. However, in this instance, because the pixel emits light at the white gray level in the emission period Tem, there is no reduction in the contrast ratio. And, a user does not perceive that the pixel emits light in the initialization and sampling period Tis. Namely, the embodiment of the disclosure can prevent a reduction in the contrast ratio when the black gray level and the white gray level are represented, by initializing the anode voltage of the OLED to the data voltage Vdata in the initialization and sampling period Tis. The black gray level is a minimum gray value, for example, $00000000_{(2)}$ of pixel data, and the white gray level is a maximum gray value, for example, $11111111_{(2)}$ of pixel data. The luminance of the pixel at the black gray level is a minimum luminance, and the luminance of the pixel at the white gray level is a maximum luminance.

Figure 16:
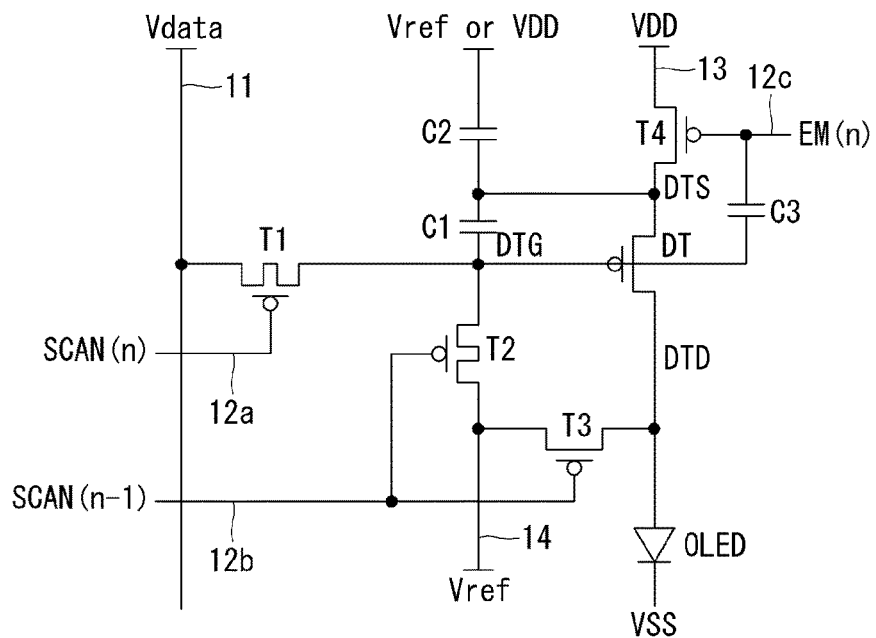
FIGS. 16 to 18 are circuit diagrams illustrating an example where a third capacitor is connected to a pixel circuit according to one embodiment.
Figure 17:
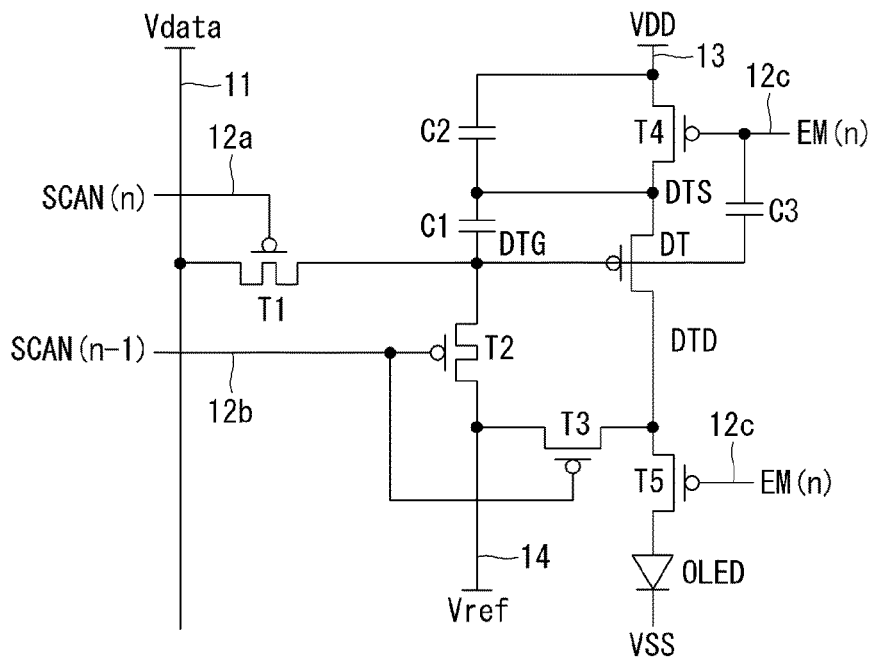
Figure 18:
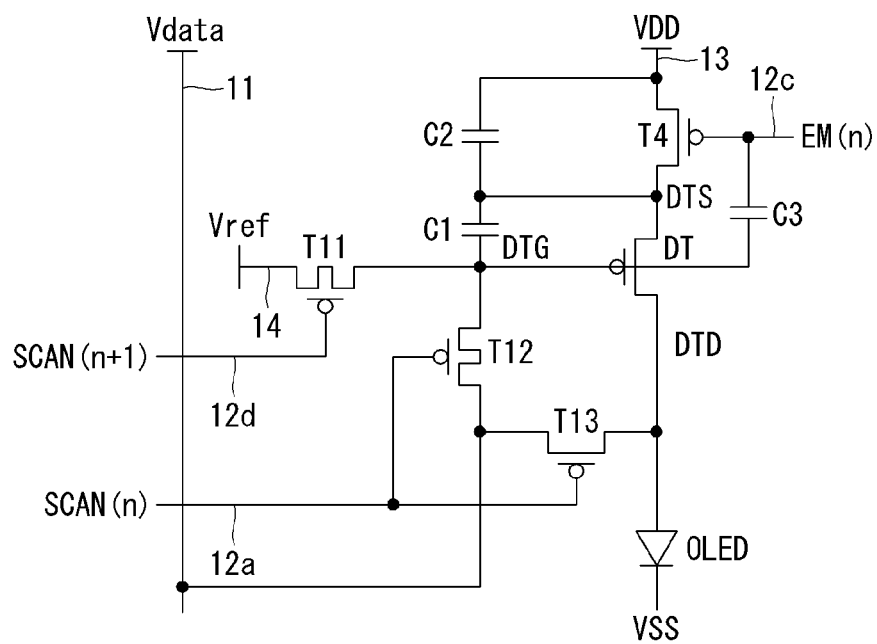

FIGS. 16 to 18 are circuit diagrams illustrating an example where a third capacitor is connected to the pixel circuits 20, 30 and 40. In detail, FIG. 16 illustrates an example where a third capacitor C3 is added to the pixel circuit 20 shown in FIGS. 2 to 7, FIG. 17 illustrates an example where a third capacitor C3 is added to the pixel circuit 30 shown in FIG. 10, and FIG. 18 illustrates an example where a third capacitor C3 is added to the pixel circuit 40 shown in FIGS. 11 to 15. The third capacitor may be applied to other embodiments as well as the above-described embodiments. Structures and components identical or equivalent to those illustrated in FIGS. 1 to 15 are designated with the same reference numerals in FIGS. 16 to 18, and a further description may be briefly made or may be entirely omitted.

Referring to FIGS. 16 to 18, each of pixel circuits 20-1, 30-1 and 40-1 further includes a third capacitor C3 connected between a first node DTG and an EM signal line 12c.

As described above, when an emission period Tem starts, a voltage of an EM signal EM(n) is reduced to a gate-on voltage. In this instance, because the first node DTG is coupled to the EM signal line 12c through the third capacitor C3, a voltage of the first node DTG is reduced and a source-to-gate voltage Vsg of a driving TFT DT increases when the voltage of the EM signal EM(n) is reduced to the gate-on voltage. Hence, a luminance of a pixel may increase at a white gray level, and a contrast ratio may increase. As a result, the embodiment of the disclosure has an advantage in implementing a high dynamic range (HDR). And, when a voltage of the EM signal line 12c is changed to the gate-on voltage, the source-to-gate voltage Vsg of the driving TFT DT increases to a voltage greater than a voltage of a first capacitor C1 due to the coupling through the third capacitor C3, and a luminance of the pixel can further increase.

Figure 19:
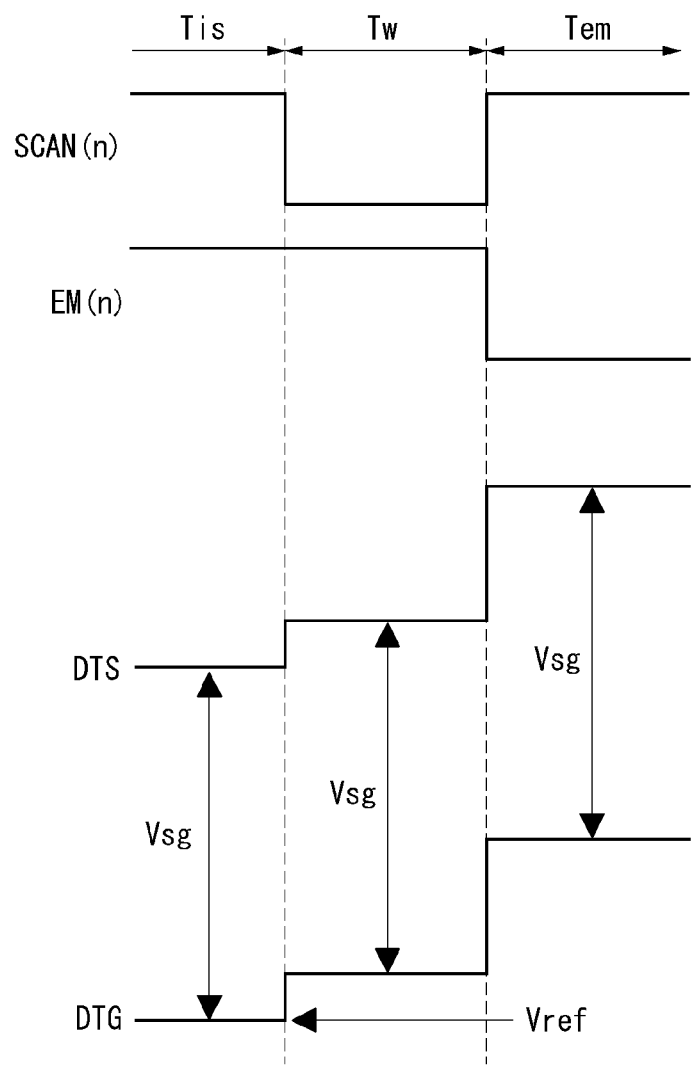
FIGS. 19 and 20 are waveform diagrams illustrating changes in a source-to-gate voltage of a driving TFT depending on the presence or absence of a third capacitor.
Figure 20:
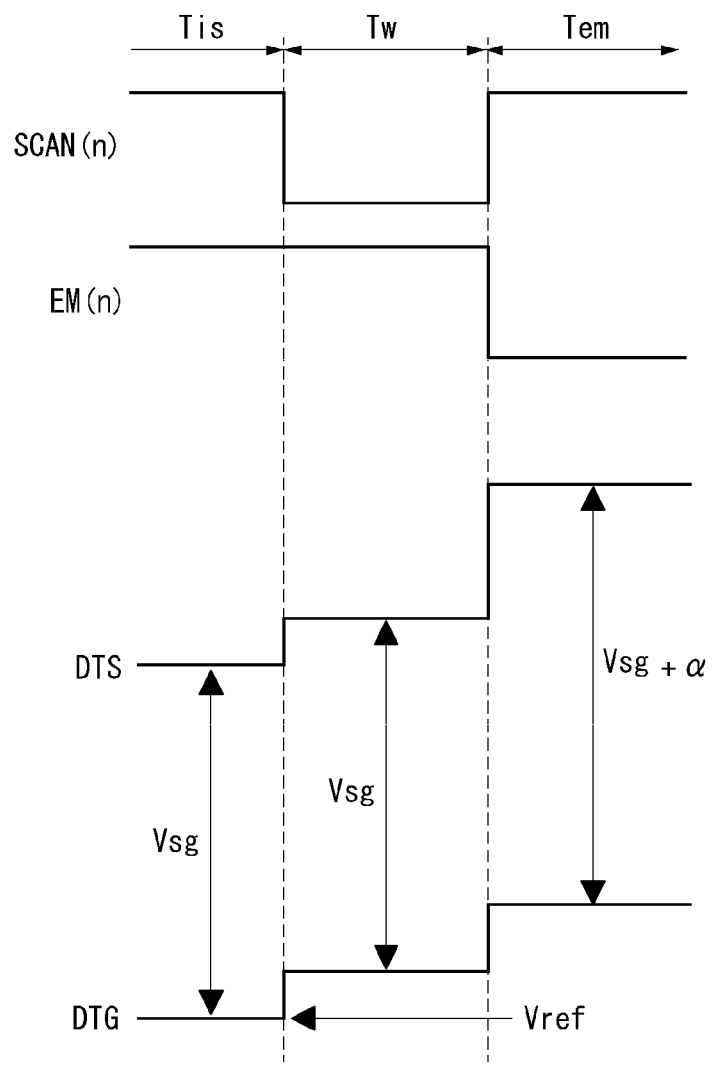

FIG. 19 illustrates a source-to-gate voltage Vsg of a driving TFT DT in a pixel circuit not including the third capacitor C3. FIG. 20 illustrates an example where a source-to-gate voltage Vsg of a driving TFT DT increases by "α" because a voltage of a first node DTG is further reduced when a third capacitor C3 is added to a pixel circuit. The source-to-gate voltage Vsg of the driving TFT DT is represented by the following Equation, $$Vsg = Vs - Vg = \left(\frac{C2}{C1+C2}\right)(Vref - Vdata) + |Vth|,$$

and α is represented by the following Equation, $$\alpha = \left(\frac{C3}{C1+C3}\right)\Delta VEM = \left(\frac{C3}{C1+C3}\right)(VEH - VEL),$$

where VEH is a gate-off voltage (or a high level voltage) of an EM signal EM(n), and VEL is a gate-on voltage (or a low level voltage) of the EM signal EM(n).

Figure 21:
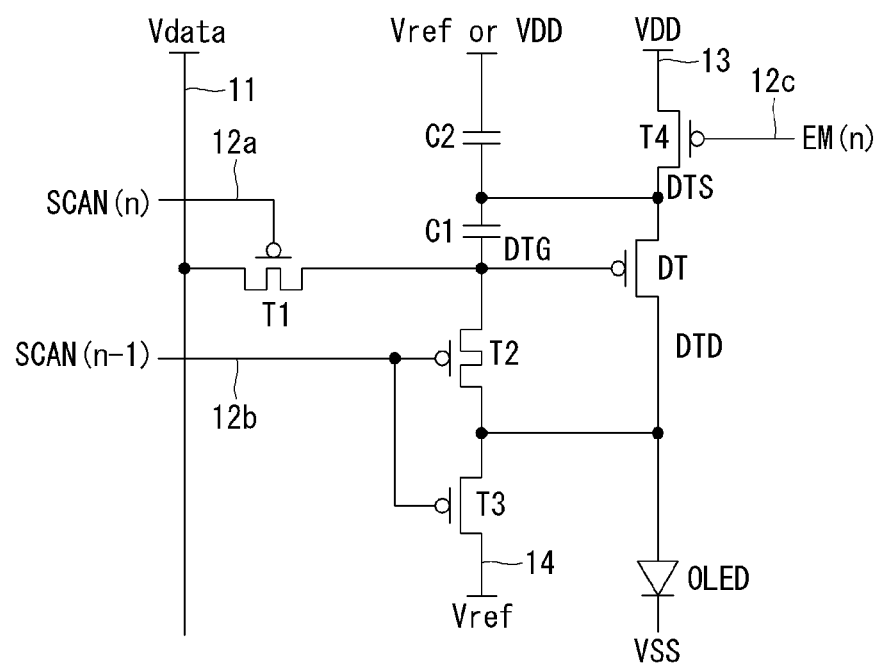
FIGS. 21 to 23 are circuit diagrams illustrating an example where a connection relationship between second and third switching TFTs of a pixel circuit is changed according to one embodiment.
Figure 22:
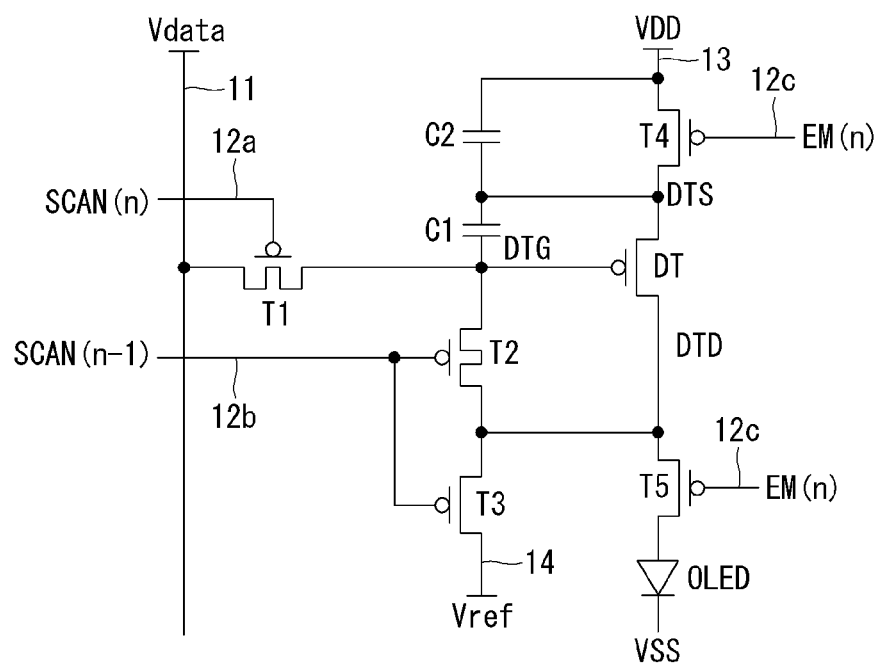
Figure 23:
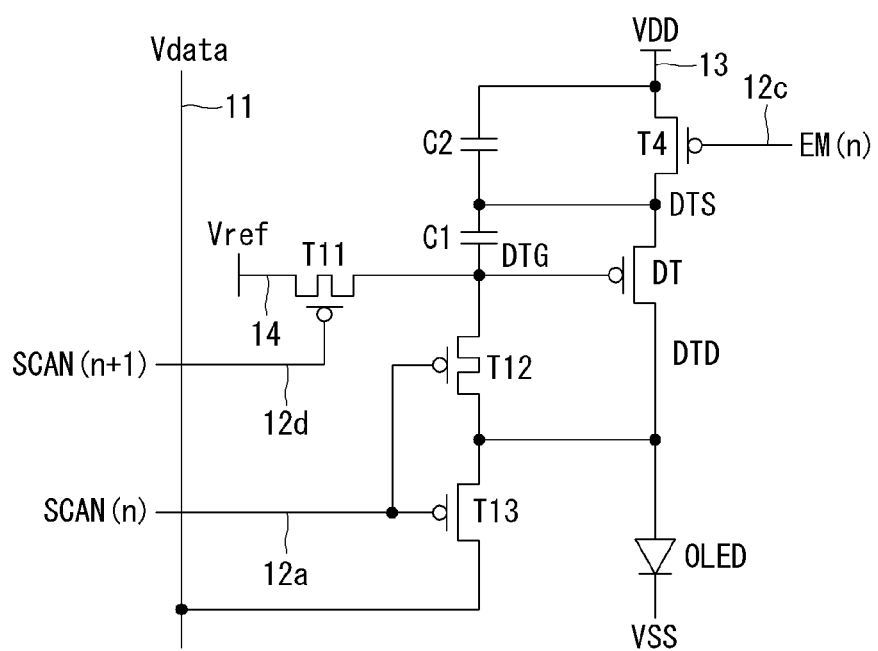

A connection structure of the second and third switching TFTs T2, T12, T3 and T13 in the pixel circuits 20, 30 and 40 may be changed as shown in FIGS. 21 to 23. Operations and effects of circuits illustrated in FIGS. 21 to 23 are substantially the same as those of the above-described embodiments.

FIGS. 21 to 23 are circuit diagrams illustrating an example where a connection structure of second and third switching TFTs of pixel circuits 20-2, 30-2 and 40-2 is changed. In detail, FIG. 21 illustrates an example where a connection structure of the second and third switching TFTs T2 and T3 of the pixel circuit 20 shown in FIGS. 2 to 7 is changed, FIG. 22 illustrates an example where a connection structure of the second and third switching TFTs T2 and T3 of the pixel circuit 30 shown in FIG. 10 is changed, and FIG. 23 illustrates an example where a connection structure of the second and third switching TFTs T12 and T13 of the pixel circuit 40 shown in FIGS. 11 to 15 is changed. Structures and components identical or equivalent to those illustrated in FIGS. 1 to 20 are designated with the same reference numerals in FIGS. 21 to 23, and a further description may be briefly made or may be entirely omitted.

Referring to FIGS. 21 to 23, the second switching TFTs T2 and T12 respectively include gates connected to scan lines 12b and 12a, sources connected to a third node DTD, and drains connected to a first node DTG. The third switching TFTs T3 and T13 respectively include gates connected to the scan lines 12b and 12a, sources connected to a Vref line 14 and data line 11, and drains connected to the third node DTD.

In the pixel circuits 20-2, 30-2 and 40-2 shown in FIGS. 21 to 23, because the second and third switching TFTs T2, T12, T3 and T13 are present on a current path between the first node DTG and the Vref line 14 or a current path between the first node DTG and a data line 11, a leakage current can be further reduced compared to the embodiment including only the second switching TFTs T2 and T12. The connection structure of the second and third switching TFTs T2, T12, T3 and T13 may be selected depending on the structure or the driving method of the display panel, and is not limited to them.

FIG. 24 illustrates a pixel circuit and a method of driving the same according to a third embodiment of the disclosure. In the third embodiment of the disclosure, transistors included in the pixel circuit are implemented as NMOS transistors by way of example.

Referring to FIG. 24, each pixel circuit 50 includes an OLED, a plurality of TFTs NDT and NT1, NT2, NT3, NT4, and NT5, first and second capacitors C1 and C2, and the like.

A high potential driving voltage VDD, a low potential power voltage VSS, a reference voltage Vref, a (n–1)th scan signal SCAN(n–1), an nth scan signal SCAN(n), a data voltage Vdata, etc. are provided for an nth pixel circuit 50. For example, the high potential driving voltage VDD may be a DC voltage of 7V to 8V, the low potential power voltage VSS may be a DC voltage of 0V, and the reference voltage Vref may be a DC voltage of 1V. However, embodiments are not limited thereto. The data voltage Vdata may be a voltage between 0V and 5V generated by a data driver 102, but embodiments are not limited thereto. Each of the scan signals SCAN(n–1) and SCAN(n) is generated to have a pulse width of one horizontal period 1H and swings between a VGH and a VGL. In the embodiment of the disclosure, the TFTs NDT and NT1 to NT5 are implemented as NMOS transistors by way of example. Therefore, a gate-on voltage is the VGH, and a gate-off voltage is the VGL. For example, the VGH may be about 10V, and the VGL may be about –6V. However, embodiments are not limited thereto.

The nth scan signal SCAN(n) synchronized with the nth data voltage Vdata(n) is supplied to the nth pixel circuit 50 subsequent to the (n–1)th scan signal SCAN(n–1). An operation of the pixel circuit 50 may be dividedly performed in an initialization and sampling period Tis, a pixel driving voltage setting period Tw, and an emission period Tem. The (n−1)th scan signal SCAN(n−1) is input to the nth pixel circuit 50 during the initialization and sampling period Tis, and the (n−1)th scan signal SCAN(n−1) is held at the gate-off voltage during a remaining period except the initialization and sampling period Tis. The nth scan signal SCAN(n) is input to the nth pixel circuit 50 during the pixel driving voltage setting period Tw, and the nth scan signal SCAN(n) is held at the gate-off voltage during a remaining period except the pixel driving voltage setting period Tw. An EM signal EM(n) is generated as the gate-off voltage during about three horizontal periods overlapping the (n−1)th and nth scan signals SCAN(n−1) and SCAN(n). The EM signal EM(n) is repeatedly switched between the gate-on voltage and the gate-off voltage in a predetermined PWM duty ratio during the emission period Tem and switches on and off a current of the OLED.

The OLED emits light using an amount of current, that is adjusted by the driving TFT DT depending on the data voltage Vdata, and represents a luminance corresponding to a grayscale of data of an input image. A current path of the OLED is switched on and off by the fourth switching TFT NT4 that is controlled in response to the EM signal EM(n). The OLED includes an anode, a cathode, and an organic compound layer between the anode and the cathode. The anode of the OLED is connected to a source of the driving TFT NDT via a second node DTS and the fifth switching TFT NT5, and the cathode of the OLED is connected to a VSS electrode supplied with the VSS.

The driving TFT NDT is a driving element for controlling a current Ioled flowing in the OLED depending on a source-to-gate voltage Vsg of the driving TFT NDT. The driving TFT NDT includes a gate connected to a first node DTG, the source connected to the second node DTS, and a drain connected to a third node DTD.

The first capacitor C1 is connected between the first node DTG and the second node DTS. The second capacitor C2 includes a first electrode receiving a voltage from a VDD line 13 or a Vref line 14 and a second electrode connected to the second node DTS.

A switching circuit (for example, the first to fifth switching TFTs NT1 to NT5) of the pixel circuit 50 supplies the reference voltage Vref to the gate and the drain of the driving TFT NDT in response to the (n−1)th scan signal SCAN(n−1) and then supplies the data voltage Vdata to the gate of the driving TFT NDT in response to the nth scan signal SCAN(n). Next, the switching circuit supplies the high potential driving voltage VDD greater than the reference voltage Vref to the drain of the driving TFT NDT in response to the EM signal EM(n), and at the same time forms a current path between the source of the driving TFT NDT and the anode of the OLED.

The first switching TFT NT1 is a switching element for supplying the data voltage Vdata(n) to the first node DTG in response to the nth scan signal SCAN(n) or a first scan signal SCAN1. The first switching TFT NT1 includes a gate connected to a first scan line 12a, a drain connected to a data line 11, and a source connected to the first node DTG. The nth scan signal SCAN(n) or the first scan signal SCAN1 is supplied to the nth pixel circuit 50 via the first scan line 12a.

The second switching TFT NT2 is a switching element for supplying the reference voltage Vref to the first node DTG in response to the (n−1)th scan signal SCAN(n−1) or a second scan signal SCAN2. A pulse width of the second scan signal SCAN2, as shown in FIG. 9, may be set to be longer than a pulse width of the first scan signal SCAN1 at a high resolution. The second switching TFT NT2 includes a gate connected to a second scan line 12b, a source connected to the Vref line 14, and a drain connected to the first node DTG.

The third switching TFT NT3 is a switching element for supplying the reference voltage Vref to the third node DTD in response to the (n−1)th scan signal SCAN(n−1) or the second scan signal SCAN2. The third switching TFT NT3 includes a gate connected to the second scan line 12b, a source connected to the Vref line 14, and a drain connected to the third node DTD.

The fourth switching TFT NT4 is a switching element for switching on and off a current path between the VDD line 13 and the third node DTD in response to the EM signal EM(n). The fourth switching TFT NT4 includes a gate connected to a third EM signal line 12c supplied with the EM signal EM(n), a drain connected to the VDD line 13, and a source connected to the third node DTD.

The fifth switching TFT NT5 is a switching element for switching on and off a current flowing in the OLED in response to the EM signal EM(n). The fifth switching TFT NT5 includes a gate connected to the third EM signal line 12c supplied with the EM signal EM(n), a drain connected to the second node DTS, and a source connected to the anode of the OLED. The fifth switching TFT NT5 cuts off the current of the OLED so that the OLED does not emit light during the initialization and sampling period Tis, and prevents an increase in a luminance of a black gray level, thereby improving a contrast ratio. And, the fourth switching TFT T4 in the embodiment illustrated in FIGS. 2 to 9 may perform functions of the fourth and fifth switching TFTs NT4 and NT5 in the third embodiment illustrated in FIG. 24.

Figure 25:
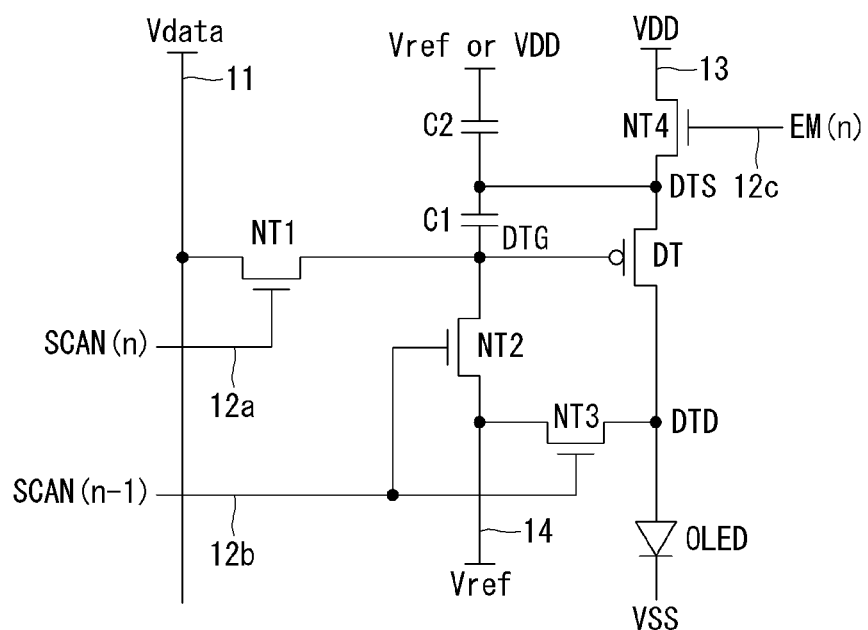
FIG. 25 illustrates a pixel circuit and a method of driving the same according to a fourth embodiment of the disclosure.

FIG. 25 illustrates a pixel circuit and a method of driving the same according to a fourth embodiment of the disclosure. The fourth embodiment is configured such that some switching TFTs T1, T2, T3, and T4 of the pixel circuit 20 illustrated in FIGS. 2 to 7 are changed from PMOS transistors to NMOS transistors.

An electroluminescent display according to an embodiment of the disclosure can drive pixels at a low speed by reducing a frame rate, in order to reduce power consumption when a still image is displayed. In this instance, because a data update cycle becomes longer, a flicker may occur when a leakage current is generated in the pixel. When the TFTs NT1, NT2, NT3 and NT4 having a long off-period are manufactured as n-type oxide TFTs having a small off-current, the flicker and the power consumption in a low-speed drive can be reduced. In particular, when the first switching TFT NT1, the second switching TFT NT2, and the third switching TFT NT3 connected to the gate of the driving TFT DT, that may generate a large amount of leakage current, are implemented as oxide TFTs, the first to third switching TFTs NT1 to NT3 can reduce an off-current even if they are not implemented as transistors of a dual gate structure. The driving TFT DT may be implemented as a p-type low temperature polysilicon (LTPS) TFT having high mobility in consideration of the efficiency of the OLED and the power consumption.

In the embodiments illustrated in FIGS. 24 and 25, a third capacitor C3 may be connected between the first node connected to the gates of the driving TFTs NDT and DT and the third EM signal line 12c supplied with the emission control signal. The connection relationship between the second and third switching TFTs NT2 and NT3 may be applied to the embodiments illustrated in FIGS. 21 to 23.

Figure 26:
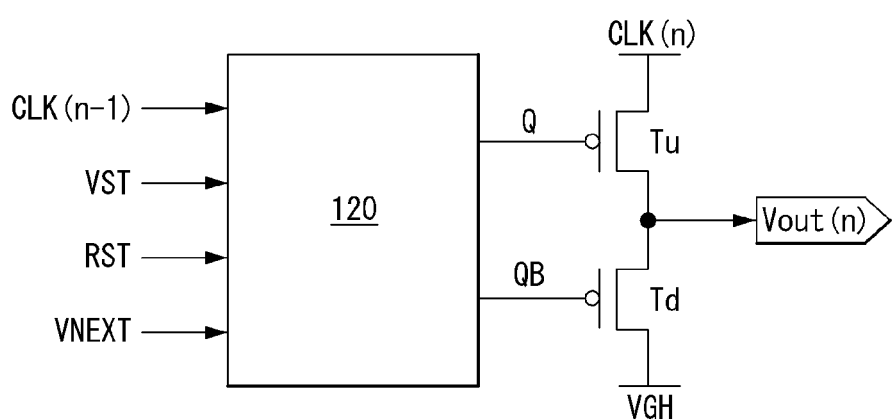
FIG. 26 is a circuit diagram schematically illustrating one stage outputting a gate pulse in a shift register of a gate driver according to one embodiment.
Figure 27:
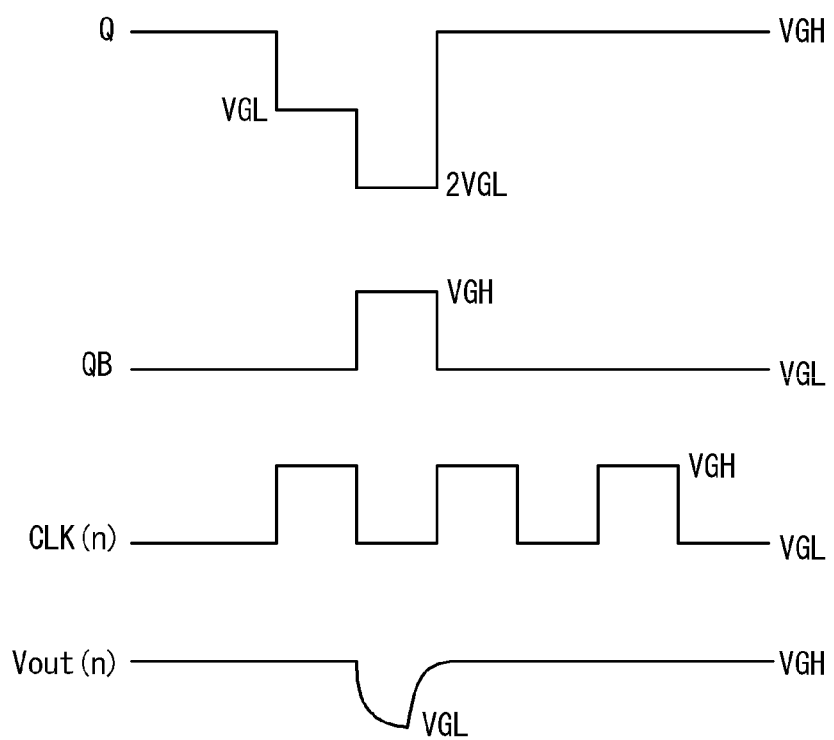
FIG. 27 is a waveform diagram illustrating an operation of a stage shown in FIG. 26.
Figure 28:
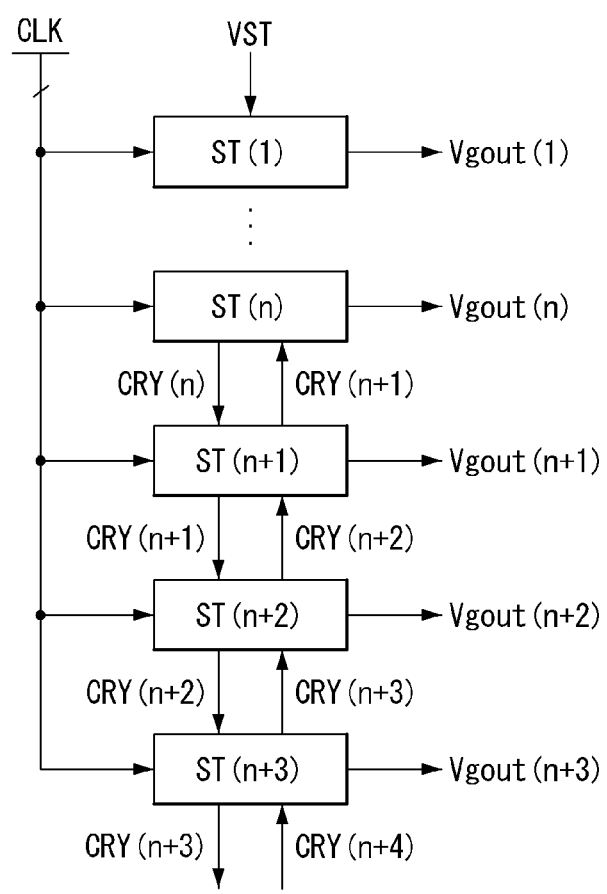
FIG. 28 illustrates cascade-connected stages of a shift register of a gate driver according to one embodiment.

FIGS. 26 to 28 illustrate a shift register of a gate driver according to one embodiment.

Referring to FIGS. 26 to 28, each of the scan driver 103 and the EM driver 104 of the gate driver 108 includes a shift register that sequentially shifts an output in response to a gate timing control signal from the timing controller 110.

The shift register of the gate driver 108 includes a plurality of cascade-connected stages ST(1) to ST(n+3) and shifts an output voltage in accordance with a shift clock timing as shown in FIG. 28. The shift register receives a start pulse VST or a carry signal received from a previous stage as a start pulse and generates an output signal when a clock is input. An output signal of the scan driver 103 is a scan signal, and an output signal of the emission driver 104 is an EM signal.

Each of the stages ST(1) to ST(n+3) of the shift register includes a pull-up transistor Tu that charges an output terminal in response to a voltage of a Q node and rises a voltage of an output signal to the gate-on voltage VGL, a pull-down transistor Td that discharges the output terminal to the gate-off voltage VGH in response to a voltage of a QB node, and a switching circuit 120 that charges and discharges the Q node and the QB node as shown in FIG. 26.

When a shift clock CLK(n) is input to a drain of the pull-up transistor Tu in a state where the Q node is pre-charged with the gate-on voltage VGL, the pull-up transistor Tu charges the output terminal up to the gate-on voltage VGL of the shift clock CLK(n). The shift clock CLK(n) is input to the pull-up transistor Tu in a state where the Q node is charged with the gate-on voltage VGL and is floated. When the gate-on voltage VGL of the shift clock CLK(n) is input to the drain of the pull-up transistor Tu, bootstrapping is generated by a parasitic capacitance between the drain and a gate of the pull-up transistor Tu. Hence, the voltage of the Q node increases to about 2VGL (i.e., about two times the gate-on voltage VGL). In this instance, the pull-up transistor Tu is turned on by the voltage 2VGL of the Q node, and the output terminal is charged up to the VGL of the shift clock CLK(n). When the QB node is charged with the VGL, the pull-down transistor Td supplies the gate-off voltage VGH to the output terminal and adjusts an output voltage Vout(n) to the VGH. A voltage Vgout(n) of an output signal is supplied to the scan line or the EM signal line and is also supplied to a previous stage and a next stage as carry signals CRY(n) to CRY(n+4).

The switching circuit 120 charges the Q node in response to the start pulse VST input through a VST terminal or the carry signals CRY(n) to CRY(n+4) received from the previous stage and discharges the Q node in response to a signal received through a reset (RST) terminal or a VNEXT terminal. The RST terminal receives a reset signal for simultaneously initializing the Q nodes of all the stages ST(1) to ST(n+3), and the VNEXT terminal receives a carry signal generated in a next stage. The switching circuit 120 may charge and discharge the QB node as opposed to the Q node using an inverter.

The start pulse VST is applied to a first stage ST(1) of the shift register. The start pulse VST may be applied to one or more stages. The shift clock CLK(n) may be 2-phase clock, 4-phase clock, or 8-phase clock, but is not limited thereto.

Figure 29:
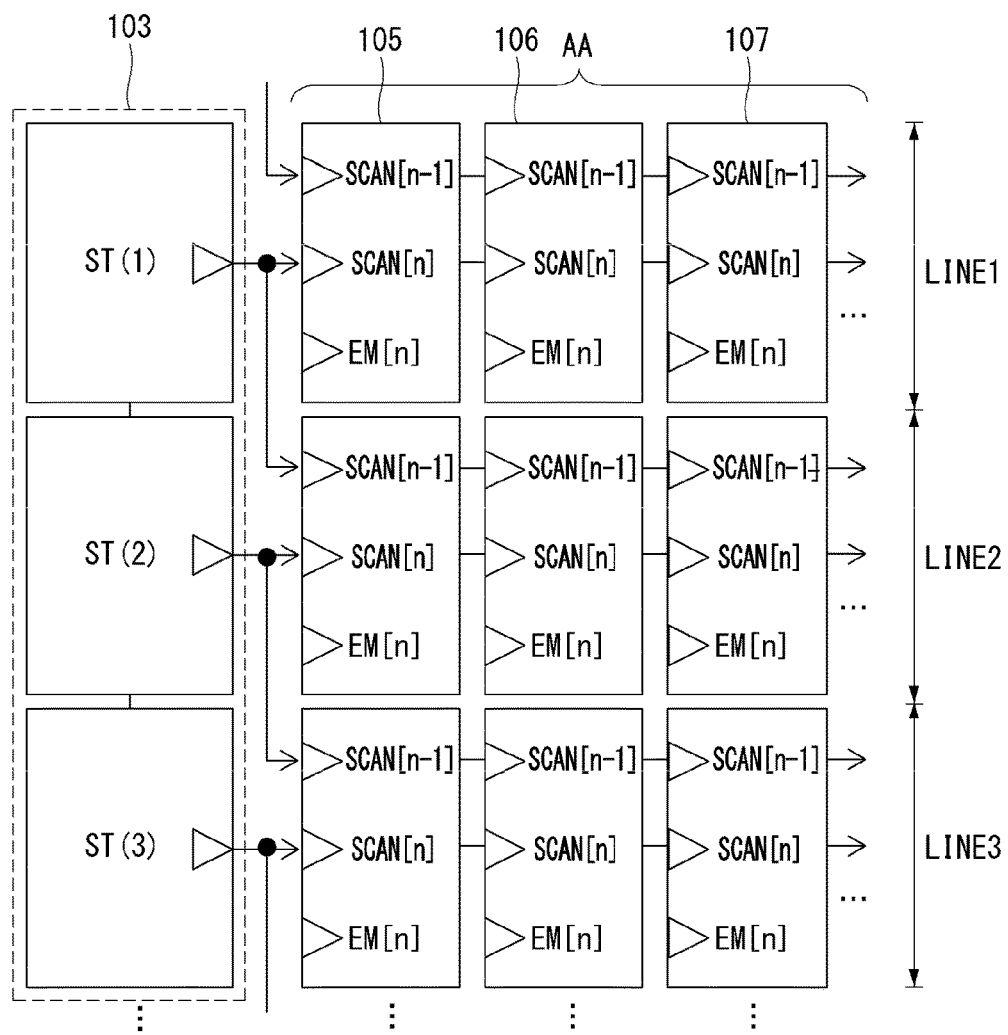
FIG. 29 illustrates a connection relationship between an output terminal of a scan driver outputting a scan signal shown in FIG. 3 and a screen display unit according to one embodiment.

FIG. 29 illustrates a connection relationship between an output terminal of a scan driver outputting scan signals SCAN(n−1) and SCAN(n) shown in FIG. 3 and a screen display unit. In FIG. 29, "LINE1", "LINE2" and "LINE3" denote display lines.

Because scan signals SCAN(n−1) and SCAN(n) have the same pulse width and are shifted at a predetermined phase difference, they may be output from one shift register without changing a gate timing control signal.

Each display line is connected to subpixels 105 to 107 on the screen display unit AA of the display panel 100. An initialization and sampling period Tis of an nth display line overlaps a pixel driving voltage setting period Tw of a (n−1)th display line. Hence, a (n−2)th scan signal and a (n−1)th scan signal are applied to subpixels 105 to 107 of the (n−1)th display line, and the (n−1)th scan signal and an nth scan signal are applied to subpixels 105 to 107 of the nth display line. Because two scan lines share one output terminal of the scan driver 103 with each other, the number of output terminals of the scan driver 103 can be reduced. Thus, the (n−1)th scan signal is input to the (n−1)th display line and the nth display line during the initialization and sampling period Tis, and the nth scan signal is input to the nth display line during the pixel driving voltage setting period Tw. As a result, one output terminal of the scan driver 103 is connected to the subpixels 105 to 107 arranged on two adjacent display lines. Because two scan signal lines of the display panel 100 may be connected to one output terminal of the scan driver 103, the narrow bezel can be implemented through a reduction in the size of the scan driver 103.

Figure 30:
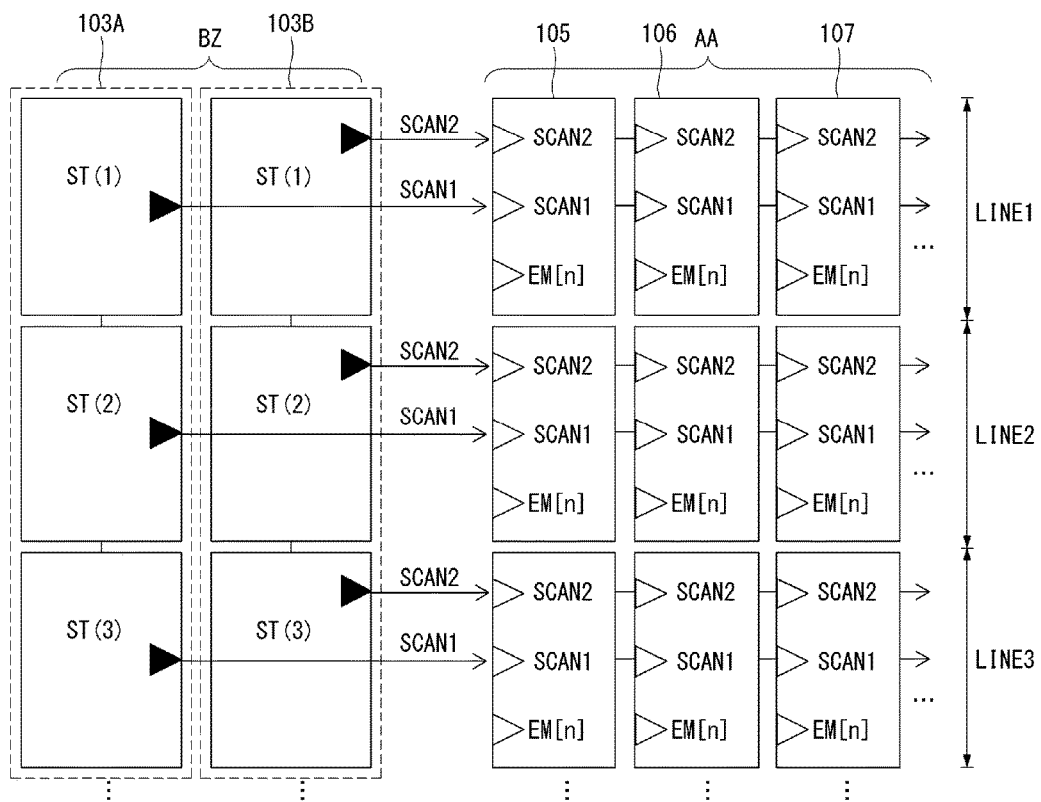
FIG. 30 illustrates a connection relationship between an output terminal of a scan driver outputting a scan signal shown in FIG. 9 and a screen display unit according to one embodiment.

FIG. 30 illustrates a connection relationship between an output terminal of a scan driver outputting scan signals SCAN1 and SCAN2 shown in FIG. 9 and a screen display unit.

Referring to FIG. 30, a sensing time of a threshold voltage of a driving TFT may be insufficient in a display device with high resolution. In this instance, as shown in FIG. 9, the sensing time of the threshold voltage can be sufficiently secured by increasing a pulse width of a second scan signal SCAN2 defining an initialization and sampling period Tis. Because the second scan signal SCAN2 is independently generated separate from a data voltage, the pulse width of the second scan signal SCAN2 may be extended. A width of a shift clock of a gate timing control signal generating the second scan signal SCAN2 has to be longer in duration than a width of a shift clock of the gate timing control signal generating a first scan signal SCAN1. The first scan signal SCAN1 and the second scan signal SCAN2 may be output using two scan drivers 103A and 103B in a bezel area BZ. The scan drivers 103A and 103B share a start pulse VST with each other and individually receive the shift clocks. The first scan driver 103A outputs the first scan signal SCAN1 and sequentially shifts the output first scan signal SCAN1. The second scan driver 103B outputs the second scan signal SCAN2 and sequentially shifts the output second scan signal SCAN2.

Figure 31:
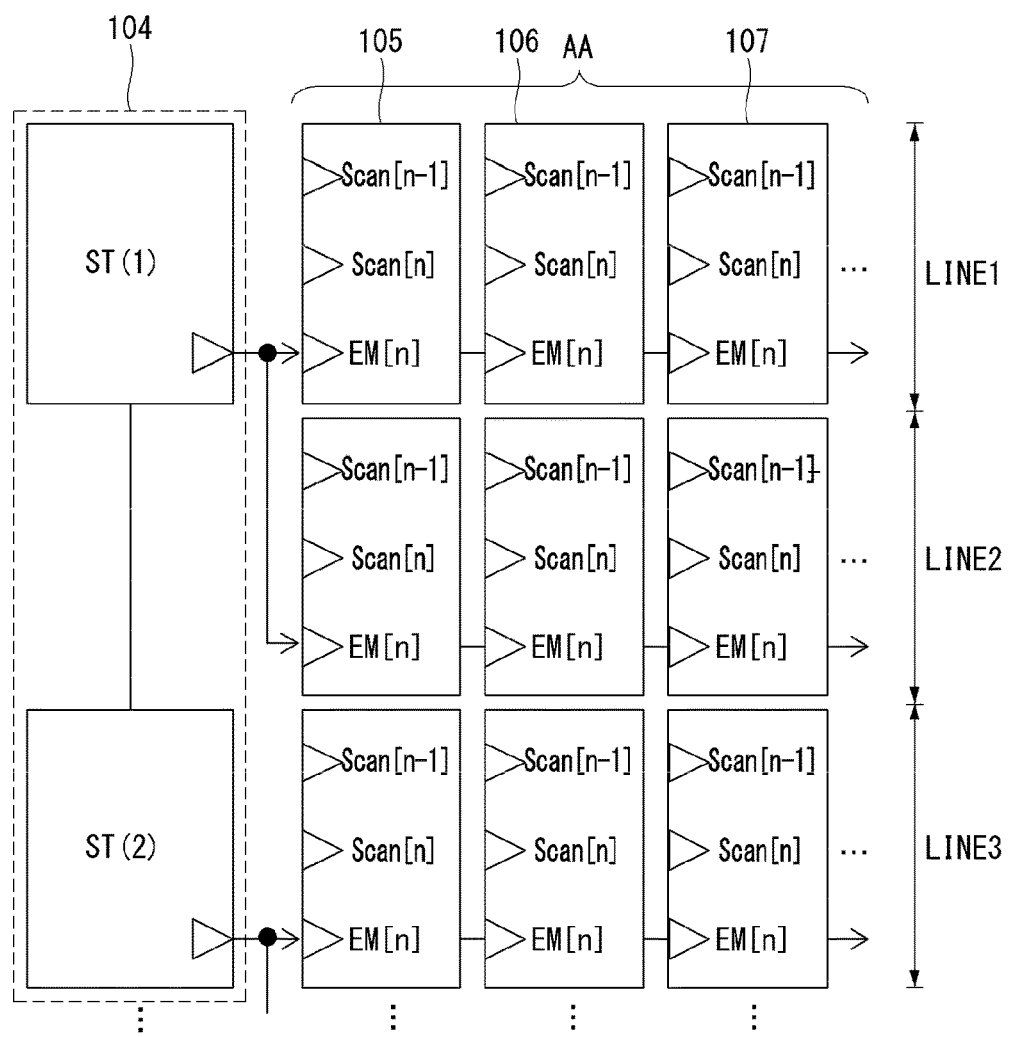
FIG. 31 illustrates a connection relationship between an output terminal of an emission driver outputting an EM signal shown in FIGS. 3 and 9 and a screen display unit according to one embodiment.

FIG. 31 illustrates a connection relationship between an output terminal of an emission driver outputting an EM signal shown in FIGS. 3 and 9 and a screen display unit.

Because a pulse width of an EM signal EM(n) shown in FIGS. 3 and 9 is set to about three horizontal periods, the EM signal EM(n) may share two of display lines LINE1 to LINE# of the screen display unit AA. As a result, one output terminal of the emission driver 104 may be connected to subpixels 105 to 107 arranged on two adjacent display lines. Because the size of the emission driver 104 can be reduced, a bezel area may decrease by a reduction amount of the size of the emission driver 104. Because two EM signal lines of the display panel 100 can be connected to one output terminal of the emission driver 104, the narrow bezel can be implemented through a reduction in the size of the emission driver 104.

An electroluminescent display according to embodiments of the present disclosure may be described as follows.

An electroluminescent display according to an embodiment of the present disclosure comprises a display panel including a plurality of pixels, each of the plurality of pixels including subpixels. A pixel circuit of each subpixel includes a driving transistor connected to an anode of an electroluminescent diode, the driving transistor and configured to drive the electroluminescent diode, a first switching transistor connected to the driving transistor, the first switching transistor configured to supply a first voltage to a gate electrode of the driving transistor in response to a first scan signal, a second switching transistor connected to the driving transistor, the second switching transistor configured to supply a second voltage to the gate electrode of the driving transistor in response to a second scan signal, a third switching transistor connected to the second switching transistor and the driving transistor, the third switching transistor configured to supply the second voltage to a first electrode of the driving transistor in response to the second scan signal, a fourth switching transistor connected to the driving transistor, the fourth switching transistor configured to supply a first supply voltage to a second electrode of the driving transistor in response to an emission control signal, a first capacitor connected between a first node that is connected to the gate electrode of the driving transistor and a second node that is connected to the second electrode of the driving transistor, and a second capacitor connected between the second node and a power supply line supplied with the second voltage or the first supply voltage. A second supply voltage is applied to a cathode of the electroluminescent diode, the second supply voltage lower than the first supply voltage. Thus, the electroluminescent display according to the present disclosure can implement uniform image quality over the entire screen without designing VDD lines at a low resistance and can reduce power consumption because the high potential driving voltage and a reference voltage are not short-circuited.

According to one or more embodiments, a change in the first supply voltage may be reflected both at the first node and the second node during a sampling period for sensing a threshold voltage of the driving transistor or during an emission period of the electroluminescent display during which the electroluminescent diode emits light According to one or more embodiments, the first voltage may be a data voltage synchronized with the first scan signal, and the second voltage may be a reference voltage that is greater than the second supply voltage and is less than the first supply voltage. In one or more embodiments, the first scan signal may be an nth scan signal, and the second scan signal may be a (n−1)th scan signal generated before the first scan signal, where n is a positive integer.

According to one or more embodiments, the first voltage may be a reference voltage that is greater than the second supply voltage and may be less than the first supply voltage, and the second voltage may be a data voltage synchronized with the first scan signal. In the embodiment, the first scan signal may be a (n+1)th scan signal, and the second scan signal may be an nth scan signal generated before the first scan signal, where n is a positive integer.

According to one or more embodiments, the second switching transistor and the third switching transistor may be turned on in accordance with a gate-on voltage of the (n−1)th scan signal. The first switching transistor may be turned on in accordance with a gate-on voltage of the nth scan signal. After the first switching transistor, the second switching transistor, and the third switching transistor are turned off, the fourth switching transistor may be turned on in accordance with a gate-on voltage of the emission control signal. The fourth switching transistor may maintain an off-state during an off-period of the emission control signal overlapping.

According to one or more embodiments, the first switching transistor and the second switching transistor may each include a dual gate structure.

According to one or more embodiments, the second scan signal may be applied to (n−1)th subpixels and synchronized with a (n−1)th data voltage, where n is a positive integer. The first scan signal may be applied to nth subpixels and synchronized with an nth data voltage. The first scan signal may be supplied to the pixel circuit subsequent to the second scan signal.

According to one or more embodiments, a pulse width of the second scan signal may be longer in duration than a pulse width of the first scan signal.

According to one or more embodiments, the first switching transistor, the second switching transistor, the third switching transistor, the fourth switching transistor, and the driving transistor may be p-type transistors.

According to one or more embodiments, the electroluminescent display may further include a scan driver configured to output the second scan signal and the first scan signal, an emission driver configured to output the emission control signal, and a plurality of display lines connected to the subpixels. One output terminal of the scan driver may be connected to a pair of subpixels arranged on two adjacent display lines of the plurality of display lines.

According to one or more embodiments, one output terminal of the emission driver may be connected to the pair of subpixels arranged on two adjacent display lines of the plurality of display lines.

According to one or more embodiments, the electroluminescent display may further include a first scan driver configured to output the second scan signal, a second scan driver configured to output the first scan signal, an emission driver configured to output the emission control signal, and a plurality of display lines connected to the subpixels. The first scan driver and the second scan driver may share a common start pulse and the first scan driver and the second scan driver receive shift clocks having different pulse widths.

According to one or more embodiments, one output terminal of the emission driver may be connected to a pair of subpixels arranged on two adjacent display lines of the plurality of display lines.

According to one or more embodiments, the electroluminescent display may further include a third capacitor connected between the first node and a third node, the third node connected to a gate electrode of the fourth switching transistor and a signal line supplied with the emission control signal.

According to one or more embodiments, at least one of the first switching transistor, the second switching transistor, the third switching transistor, and the fourth switching transistor may be a n-type oxide transistor, and the driving transistor may be a p-type polysilicon transistor.

An electroluminescent display according to an embodiment of the present disclosure comprises a display panel including a plurality of pixels each of the plurality of pixels including subpixels. A pixel circuit of each subpixel includes a driving transistor connected to an anode of an electroluminescent diode, the driving transistor configured to drive the electroluminescent diode, a switching circuit configured to supply a reference voltage that is less than a first supply voltage and greater than a second supply voltage that is less than the first supply voltage to a gate electrode and a first electrode of the driving transistor in response to a (n−1)th scan signal, the switching circuit configured to supply a data voltage to the gate electrode of the driving transistor in response to an nth scan signal, and the switching circuit configured to supply the first supply voltage to a second electrode of the driving transistor in response to an emission control signal, where n is a positive integer, a first capacitor connected between a first node that is connected to the gate electrode of the driving transistor and a second node that is connected to the second electrode of the driving transistor, and a second capacitor connected between the second node and a power supply line supplied with the reference voltage or the first supply voltage. The second supply voltage is applied to a cathode of the electroluminescent diode. Thus, the electroluminescent display according to the present disclosure can implement uniform image quality over the entire screen without designing VDD lines at a low resistance and can reduce power consumption because the high potential driving voltage and the reference voltage are not short-circuited.

According to one or more embodiments, a change in the first supply voltage may be reflected both at the first node and the second node during a sampling period for sensing a threshold voltage of the driving transistor or during an emission period of the electroluminescent display during which the electroluminescent diode emits light.

According to one or more embodiments, the switching circuit may include a first switching transistor configured to supply the data voltage to the gate electrode of the driving transistor in response to the nth scan signal, a second switching transistor configured to supply the reference voltage to the gate of the driving transistor in response to the (n−1)th scan signal, a third switching transistor configured to supply the reference voltage to the first electrode of the driving transistor in response to the (n−1)th scan signal, a fourth switching transistor configured to supply the first supply voltage to the second electrode of the driving transistor in response to the emission control signal.

An electroluminescent display according to an embodiment of the present disclosure includes a display panel including a plurality of pixels, each of the plurality of pixels including subpixels. A pixel circuit of each subpixel includes a driving transistor connected to an anode of an electroluminescent diode, the driving transistor configured to drive the electroluminescent diode, a first switching transistor connected to the driving transistor, the first switching transistor configured to supply a data voltage to a gate electrode of the driving transistor in response to an nth scan signal, where n is a positive integer, a second switching transistor connected to the driving transistor, the second switching transistor configured to supply a reference voltage that is less than a first supply voltage and greater than a second supply voltage that is less than the first supply voltage to the gate electrode of the driving transistor in response to an (n−1)th scan signal, a third switching transistor configured to supply the reference voltage to a first electrode of the driving transistor in response to the (n−1)th scan signal, a fourth switching transistor connected to the driving transistor, the fourth switching transistor configured to supply the first supply voltage to the second electrode of the driving transistor in response to an emission control signal, a fifth switching transistor connected between the driving transistor and the electroluminescent diode, the fifth switching transistor configured to form a current path between the second electrode of the driving transistor and the anode of the electroluminescent diode in response to the emission control signal, a first capacitor connected between a first node that is connected to the gate electrode of the driving transistor and a second node that is connected to the second electrode of the driving transistor, and a second capacitor connected between the second node and a power supply line supplied with the reference voltage or the first supply voltage. The second supply voltage is applied to a cathode of the electroluminescent diode. Thus, the electroluminescent display according to the present disclosure can implement uniform image quality over the entire screen without designing VDD lines at a low resistance and can reduce power consumption because the high potential driving voltage and the reference voltage are not short-circuited.

According to one or more embodiments, a change in the first supply voltage may be reflected both at the first node and the second node during a sampling period for sensing a threshold voltage of the driving transistor or during an emission period of the electroluminescent display during which the electroluminescent diode emits light.

According to one or more embodiments, a scan period of the electroluminescent display may include a sampling period for sensing the threshold voltage of the driving transistor, a pixel driving voltage setting period for setting the data voltage as the driving voltage of the driving transistor, and the emission period where the electroluminescent diode emits light. The second switching transistor and the third switching transistor may bee turned on in accordance with a gate-on voltage of the (n−1)th scan signal. After the second switching transistor and the third switching transistor are turned off in accordance with a gate-off voltage of the (n−1)th scan signal, the first switching transistor may be turned on in accordance with a gate-on voltage of the nth scan signal. After the first switching transistor, the second switching transistor, and the third switching transistor are turned off, the fourth switching transistor may be turned on in accordance with a gate-on voltage of the emission control signal. And the fourth switching transistor may maintain an off-state during an off-period of the emission control signal.

According to one or more embodiments, the first switching transistor and the second switching transistor may each include a dual gate structure.

According to one or more embodiments, the (n−1)th scan signal may be applied to (n−1)th subpixels and synchronized with a (n−1)th data voltage. The nth scan signal may be applied to nth subpixels and synchronized with an nth data voltage. The nth scan signal may be supplied to the pixel circuit subsequent to the (n−1)th scan signal.

According to one or more embodiments, a pulse width of the (n−1)th scan signal may be longer in duration than a pulse width of the nth scan signal.

According to one or more embodiments, the first switching transistor, the second switching transistor, the third switching transistor, the fourth switching transistor, fifth switching transistor and the driving transistor may be p-type transistors.

It will be apparent to those skilled in the art that various modifications and variations may be made in the present disclosure without departing from the spirit or scope of the invention. Thus, it is intended that embodiments of the present disclosure cover the modifications and variations of this invention provided they come within the scope of the appended claims and their equivalents.

Embodiments of the invention can implement uniform image quality over the entire screen without designing the VDD lines at a low resistance because a current of the OLED of the pixel is not effected by the VDD and can implement an electroluminescent display having a high resolution and a large-screen size.

Embodiments of the invention can reduce power consumption and deterioration of pixels because the VDD and the Vref are short-circuited in the pixel, thereby improving the reliability.

Embodiments of the invention can perform detailed gray-scale representation because the data voltage range can be determined depending on a ratio of capacitances of the capacitors of the pixel.

Embodiments of the invention can improve the display quality of the electroluminescent display because a time, for which the anode of the OLED is floated after the emission control signal is inverted to the gate-off voltage, can be set to a short time internal.

Embodiments of the invention can minimize or prevent a flicker and image sticking and improve the image quality by turning on and off the emission control signal at a predetermined PWM duty ratio during the emission period. And, embodiments of the invention can perform a stable duty drive because the Vsg (or the Vgs) of the driving TFT can be stored in the capacitor during the off-period of the emission control signal in the emission period.

Embodiments of the invention include an internal compensation circuit that can control a sampling period of the driving TFT to be sufficiently long by adjusting a pulse width of the scan signal. Thus, embodiments of the invention can stably secure a compensation for a difference in driving characteristics between pixels in an electroluminescent display having a high resolution and a large-screen size.

Embodiments of the invention can implement a high resolution display device with high PPI (pixels per inch) having the small unit pixel size because the internal compensation circuit can have an uncomplicated circuit configuration and a compact layout structure.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electroluminescent display comprising:
   a display panel including a plurality of pixels, each of the plurality of pixels including subpixels,
   wherein a pixel circuit of each subpixel includes:
   a driving transistor connected to an anode of an electroluminescent diode, the driving transistor configured to drive the electroluminescent diode;
   a first switching transistor connected to the driving transistor, the first switching transistor configured to supply a first voltage to a gate electrode of the driving transistor in response to a first scan signal;
   a second switching transistor connected to the driving transistor, the second switching transistor configured to supply a second voltage to the gate electrode of the driving transistor in response to a second scan signal;
   a third switching transistor connected to the second switching transistor and the driving transistor, the third switching transistor configured to supply the second voltage to a first electrode of the driving transistor in response to the second scan signal;
   a fourth switching transistor connected to the driving transistor, the fourth switching transistor configured to supply a first supply voltage to a second electrode of the driving transistor in response to an emission control signal;
   a first capacitor connected between a first node that is connected to the gate electrode of the driving transistor and a second node that is connected to the second electrode of the driving transistor; and
   a second capacitor connected between the second node and a power supply line supplied with the second voltage or the first supply voltage,
   wherein a second supply voltage is applied to a cathode of the electroluminescent diode, the second supply voltage lower than the first supply voltage.

2. The electroluminescent display of claim 1, wherein a change in the first supply voltage is reflected both at the first node and the second node during a sampling period for sensing a threshold voltage of the driving transistor or during an emission period of the electroluminescent display during which the electroluminescent diode emits light.

3. The electroluminescent display of claim 1, wherein the first voltage is a data voltage synchronized with the first scan signal,
   wherein the second voltage is a reference voltage that is greater than the second supply voltage and is less than first supply voltage, and
   wherein the first scan signal is a nth scan signal, and the second scan signal is a (n−1)th scan signal before the first scan signal, where n is a positive integer.

4. The electroluminescent display of claim 1, wherein the first voltage is a reference voltage that is greater than the second supply voltage and is less than the first supply voltage,
   wherein the second voltage is a data voltage synchronized with the first scan signal, and
   wherein the first scan signal is a (n+1)th scan signal, and the second scan signal is an nth scan signal generated before the first scan signal, where n is a positive integer.

5. The electroluminescent display of claim 1,
   wherein the second switching transistor and the third switching transistor are turned on in accordance with a gate-on voltage of the second scan signal,
   wherein the first switching transistor is turned on in accordance with a gate-on voltage of the first scan signal,
   wherein after the first switching transistor, the second switching transistor, and the third switching transistor are turned off, the fourth switching transistor is turned on in accordance with a gate-on voltage of the emission control signal, and
   wherein the fourth switching transistor maintains an off-state during an off-period of the emission control signal.

6. The electroluminescent display of claim 1, wherein the first switching transistor and the second switching transistor each include a dual gate structure.

7. The electroluminescent display of claim 1, wherein the second scan signal is applied to (n−1)th subpixels and is synchronized with a (n−1)th data voltage, where n is a positive integer,
   wherein the first scan signal is applied to nth subpixels and is synchronized with an nth data voltage, and
   wherein the first scan signal is supplied to the pixel circuit subsequent to the second scan signal.

8. The electroluminescent display of claim 1, wherein a pulse width of the second scan signal is longer in duration than a pulse width of the first scan signal.

9. The electroluminescent display of claim 1, wherein the first switching transistor, the second switching transistor, the third switching transistor, the fourth switching transistor, and the driving transistor are p-type transistors.

10. The electroluminescent display of claim 7, further comprising:
a scan driver configured to output the second scan signal and the first scan signal;
an emission driver configured to output the emission control signal; and
a plurality of display lines connected to the subpixels,
wherein one output terminal of the scan driver is connected to a pair of subpixels arranged on two adjacent display lines of the plurality of display lines.

11. The electroluminescent display of claim 10, wherein one output terminal of the emission driver is connected to the pair of subpixels arranged on two adjacent display lines of the plurality of display lines.

12. The electroluminescent display of claim 8, further comprising:
a first scan driver configured to output the second scan signal;
a second scan driver configured to output the first scan signal;
an emission driver configured to output the emission control signal; and
a plurality of display lines connected to the subpixels,
wherein the first scan driver and the second scan driver share a common start pulse and the first scan driver and the second scan driver receive shift clocks having different pulse widths.

13. The electroluminescent display of claim 12, wherein one output terminal of the emission driver is connected to a pair of subpixels arranged on two adjacent display lines of the plurality of display lines.

14. The electroluminescent display of claim 1, further comprising:
a third capacitor connected between the first node and a third node, the third node connected to a gate electrode of the fourth switching transistor and a signal line supplied with the emission control signal.

15. The electroluminescent display of claim 1, wherein at least one of the first switching transistor, the second switching transistor, the third switching transistor, and the fourth switching transistor is a n-type oxide transistor, and
wherein the driving transistor is a p-type polysilicon transistor.

16. An electroluminescent display comprising:
a display panel including a plurality of pixels, each of the plurality of pixels including subpixels,
wherein a pixel circuit of each subpixel includes:
a driving transistor connected to an anode of an electroluminescent diode, the driving transistor configured to drive the electroluminescent diode;
a switching circuit configured to supply a reference voltage that is less than a first supply voltage and greater than a second supply voltage that is less than the first supply voltage to a gate electrode and a first electrode of the driving transistor in response to a (n−1)th scan signal, the switching circuit configured to supply a data voltage to the gate electrode of the driving transistor in response to an nth scan signal, and the switching circuit configured to supply the first supply voltage to a second electrode of the driving transistor in response to an emission control signal, where n is a positive integer;
a first capacitor connected between a first node that is connected to the gate electrode of the driving transistor and a second node that is connected to the second electrode of the driving transistor; and
a second capacitor connected between the second node and a power supply line supplied with the reference voltage or the first supply voltage,
wherein the second supply voltage is applied to a cathode of the electroluminescent diode.

17. The electroluminescent display of claim 16, wherein a change in the first supply voltage is reflected both at the first node and the second node during a sampling period for sensing a threshold voltage of the driving transistor or during an emission period of the electroluminescent display during which the electroluminescent diode emits light.

18. The electroluminescent display of claim 16, wherein the switching circuit includes:
a first switching transistor configured to supply the data voltage to the gate electrode of the driving transistor in response to the nth scan signal;
a second switching transistor configured to supply the reference voltage to the gate of the driving transistor in response to the (n−1)th scan signal;
a third switching transistor configured to supply the reference voltage to the first electrode of the driving transistor in response to the (n−1)th scan signal;
a fourth switching transistor configured to supply the first supply voltage to the second electrode of the driving transistor in response to the emission control signal.

* * * * *